(12) United States Patent
Nishimura

(10) Patent No.: US 11,600,722 B2
(45) Date of Patent: Mar. 7, 2023

(54) SEMICONDUCTOR ELEMENT AND SEMICONDUCTOR DEVICE

(71) Applicant: FUJI ELECTRIC CO., LTD., Kawasaki (JP)

(72) Inventor: Takeyoshi Nishimura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/549,070

(22) Filed: Aug. 23, 2019

(65) Prior Publication Data

US 2020/0105923 A1 Apr. 2, 2020

(30) Foreign Application Priority Data

Sep. 27, 2018 (JP) .............................. JP2018-182824

(51) Int. Cl.
*H01L 29/78* (2006.01)
(52) U.S. Cl.
CPC ...... *H01L 29/7808* (2013.01); *H01L 29/7813* (2013.01)
(58) Field of Classification Search
CPC ............. H01L 29/7815; H01L 29/7811; H01L 29/7813; H01L 29/7808; H01L 29/861; H01L 29/0869; H01L 29/1095; H01L 29/0696; H01L 29/66734; H01L 29/41766; H01L 29/41741; H01L 29/66719; H01L 29/7806; H01L 29/66727; H01L 27/0629; H01L 29/8725; H01L 29/7827;

(Continued)

(56) References Cited

U.S. PATENT DOCUMENTS 4,961,100 A 10/1990 Baliga et al.
6,323,518 B1 * 11/2001 Sakamoto ............... H01L 23/62
257/330

(Continued)

FOREIGN PATENT DOCUMENTS

JP 2-50482 A 2/1990
JP 6-114844 A 5/1993

(Continued)

OTHER PUBLICATIONS

Tsukasa Suzuki et al., "Development of RBPMOS (MOS FET with Reverse Connection Battery Protection) for Automotive Application", Sanken technical report, vol. 42 (2010), pp. 15-18.

(Continued)

*Primary Examiner* — Mouloucoulaye Inoussa

(57) ABSTRACT

Provided are a semiconductor element and a semiconductor device capable of achieving on-resistance reduction and miniaturization. The semiconductor element is used in a semiconductor switch for protecting an electric circuit, and includes a semiconductor substrate SB, a MOS transistor Tr provided on the semiconductor substrate SB, and a source electrode SE provided on a front surface 2a side of the semiconductor substrate SB. The MOS transistor Tr includes an n-type source region 8 connected to the source electrode SE, an n-type drift region 21 arranged away from the source region 8, and a p-type well region 31 arranged between the source region 8 and the drift region 21. The source region 8 is interposed between the source electrode SE and the well region 31.

21 Claims, 14 Drawing Sheets

(58) Field of Classification Search
CPC .......... H01L 29/0615; H01L 21/76897; H01L
29/4933; H01L 21/26586; H01L 29/086;
H01L 29/42368; H01L 29/456; H01L
29/872; H01L 29/866; H01L 27/0255;
H01L 29/407; H01L 29/0619; H01L
29/0638; H01L 29/7397; H01L 29/66348;
H01L 29/0804; H01L 29/0611; H01L
29/41708; H01L 29/408; H01L 29/401;
H01L 29/8083; H01L 29/1608; H01L
27/0922; H01L 27/088; H01L 21/823885;
H01L 17/687; H01L 21/823487; H01L
17/063
USPC ....... 257/144, 330, 328, 484, 127, 155, 170,
257/267, 471, 476, 49, 77, 119, 565, 266,
257/296; 438/138
See application file for complete search history.

(56) References Cited

U.S. PATENT DOCUMENTS

| | | | |
|---|---|---|---|
| 8,193,579 B2 | 6/2012 | Yoshimochi | |
| 8,435,860 B2 | 5/2013 | Yoshimochi | |
| 9,136,837 B2 | 9/2015 | Hayashi et al. | |
| 9,859,238 B2 | 1/2018 | Godo et al. | |
| 10,277,219 B2 | 4/2019 | Sander et al. | |
| 2002/0190340 A1* | 12/2002 | Moriguchi | H01L 27/0629 |
| | | | 257/484 |
| 2006/0157779 A1* | 7/2006 | Kachi | H01L 29/7811 |
| | | | 257/330 |
| 2006/0226439 A1* | 10/2006 | Robb | H01L 29/0878 |
| | | | 257/119 |
| 2006/0261391 A1* | 11/2006 | Nakazawa | H01L 29/4916 |
| | | | 257/296 |
| 2006/0284217 A1* | 12/2006 | Kumar | H01L 29/8083 |
| | | | 257/266 |
| 2009/0014719 A1* | 1/2009 | Shimizu | H01L 29/66068 |
| | | | 257/49 |
| 2010/0025759 A1 | 2/2010 | Yoshimochi | |
| 2010/0123185 A1* | 5/2010 | Hsieh | H01L 29/7806 |
| | | | 257/328 |
| 2012/0276728 A1 | 11/2012 | Yoshimochi | |
| 2013/0181693 A1 | 7/2013 | Hayashi et al. | |
| 2013/0187223 A1* | 7/2013 | Matsuura | H01L 29/66734 |
| | | | 257/330 |
| 2014/0070319 A1 | 3/2014 | Tonomura et al. | |
| 2015/0214213 A1 | 7/2015 | Tonomura et al. | |
| 2016/0020276 A1 | 1/2016 | Lu | |
| 2016/0027906 A1* | 1/2016 | Onozawa | H01L 29/66348 |
| | | | 257/144 |
| 2016/0358869 A1 | 12/2016 | Godo et al. | |
| 2017/0062574 A1* | 3/2017 | Nagata | H01L 29/0623 |
| 2017/0162662 A1* | 6/2017 | Naito | H01L 29/4236 |
| 2018/0183427 A1 | 6/2018 | Nakajima et al. | |
| 2018/0315747 A1* | 11/2018 | Agam | H01L 21/76224 |

FOREIGN PATENT DOCUMENTS

| | | |
|---|---|---|
| JP | 4178331 A | 11/2008 |
| JP | 2009-88006 A | 4/2009 |
| JP | 2010-034285 A | 2/2010 |
| JP | 2013-150053 A | 8/2013 |
| JP | 2016-21539 A | 2/2016 |
| JP | 5990437 B2 | 9/2016 |
| JP | 2018-107331 A | 7/2018 |
| WO | 2015/198435 A1 | 12/2015 |

OTHER PUBLICATIONS

Office Action, dated Jul. 12, 2022, in corresponding Japanese Patent Application No. 2018-182824 (12 pp.).

* cited by examiner

SEMICONDUCTOR ELEMENT AND SEMICONDUCTOR DEVICE

CROSS-REFERENCE TO RELATED APPLICATIONS

This application claims benefit of priority under 35 U.S.C. § 119 to Japanese Patent Application No. 2018-182824, filed on Sep. 27, 2018, the entire contents of which is incorporated by reference herein.

TECHNICAL FIELD

The present invention relates to a semiconductor element and a semiconductor device.

BACKGROUND ART

In a drive circuit for automotive use, a semiconductor switch is arranged on an upstream side thereof to prevent a breakdown in an electronic control unit (ECU) or the like. When an abnormality occurs in the drive circuit or the like, the circuit is interrupted by the semiconductor switch to protect the ECU. Additionally, in electric circuits for use in vehicles or the like, reverse battery connection is sometimes accidentally made. Therefore, there has been a desire for a technology that prevents breakdowns in ECUs or the like.

To prevent breakdowns in such electric circuits or the like, there have been conventionally used integrated circuits including a semiconductor switch formed by bidirectionally arranging discrete n-type metal oxide semiconductor (MOS) transistors or the like. In the conventional integrated circuits, for example, a source electrode of a MOS transistor and a source electrode of a second MOS transistor are connected to prevent a breakdown due to reverse battery connection. Additionally, a body diode (parasitic diode) is connected to each of the MOS transistor and the second MOS transistor so that conduction direction is reversed. In use of such an integrated circuit as a semiconductor switch, electric current is applied while the MOS transistor and the second MOS transistor are in a conducting state when in normal use. In this case, the MOS transistor is connected in a normal connection direction, whereas the second MOS transistor is connected in a direction reverse to the normal. The second MOS transistor can be brought into the conducting state by increasing gate voltage. In addition, the body diode of the second MOS transistor is forward connected, so that current flows also through the body diode.

When large current flows due to abnormality in a load or the like, the integrated circuit forming the semiconductor switch or the like interrupts conduction of the MOS transistor and the second MOS transistor to prevent a breakdown of the load or the like. Alternatively, when battery is reversely connected, the body diode of the MOS transistor is forward connected, whereby current may flow reversely. Thus, conduction of the second MOS transistor is interrupted to prevent breakdowns of the electric circuit, a wire, and the like connected to a power supply via the integrated circuit.

Note that FIG. 1, FIG. 5, and paragraph [0018] of PTL 1 mention that a first MOS field effect transistor (MOSFET) element region and a second MOSFET element region are provided on a single substrate (semiconductor chip). Additionally, FIG. 3 and paragraph [0038] of PTL 1 illustrate a battery reverse connection preventing circuit using two MOSFETs.

FIG. 22, FIG. 30, and paragraphs [0015] and [0105] of PTL 2 mention that two MOSFET regions are provided on a semiconductor chip, and an n+ type channel stopper region or regions separated by trenches are provided at a boundary between the two MOSFET regions. Additionally, FIG. 23 of PTL 2 illustrates a battery reverse connection preventing circuit using two MOSFETs.

CITATION LIST

Patent Literature

PTL 1: JP 2009-88006 A
PTL 2: JP 2016-21539 A

SUMMARY OF INVENTION

Technical Problems

In the circuits including a plurality of MOSFETs connected in series, on-resistance and circuit area tend to increase depending on the number of the MOSFETs. Thus, on-resistance reduction and miniaturization have been desired in the battery reverse connection preventing circuits.

The present invention has been made in view of the above-described problems. It is an object of the present invention to provide a semiconductor element and a semiconductor device capable of achieving on-resistance reduction and miniaturization.

Solution to Problems

To solve the above problems, a semiconductor element according to an aspect of the present invention includes a semiconductor substrate, a field effect transistor provided on the semiconductor substrate, and a first electrode provided on one surface side of the semiconductor substrate. The field effect transistor includes an electrode region of a first conductivity type connected to the first electrode, a drift region of the first conductivity type arranged away from the electrode region, and a well region of a second conductivity type arranged between the electrode region and the drift region. The electrode region is interposed between the first electrode and the well region.

A semiconductor element according to another aspect of the present invention includes a field effect transistor, a first body diode incorporated in the field effect transistor and connected to a drain of the field effect transistor, and a second body diode incorporated in the field effect transistor and connected to a source of the field effect transistor. A forward direction of the first body diode is reverse to a forward direction of the second body diode. The first body diode and the second body diode are connected in series to each other.

A semiconductor device according to an aspect of the present invention includes any one of the semiconductor elements above and a protecting element configured to protect the any one of the semiconductor elements above. The protecting element includes a Zener diode having a lower breakdown voltage than the any one of the semiconductor elements above.

Advantageous Effects of Invention

According to the present invention, there can be provided a semiconductor element and a semiconductor device capable of achieving on-resistance reduction and miniaturization.

DESCRIPTION OF EMBODIMENTS

Embodiments of the present invention will be described hereinbelow. In the following description of the drawings, the same or similar portions are denoted by the same or similar reference signs. However, it should be noted that the drawings are schematic, and relationships between thicknesses and planar dimensions, thickness ratios between respective devices and between respective members, and the like are different from actual ones. Thus, specific thicknesses and dimensions should be determined in consideration of the description given below. It is also obvious that there are some portions different in mutual dimensional relationships and ratios between the drawings.

In addition, in the following description, Z axis positive direction may be referred to as "upper", and Z axis negative direction may be referred to as "lower". The terms "upper" and "lower" do not necessarily mean a vertical direction relative to the ground. In short, "upper" and "lower" directions are not limited to the direction of gravity. The terms "upper" and "lower" are merely expressions used for convenience to specify a relative positional relationship between regions, layers, films, substrates, or the like, and do not limit the technological idea of the present invention. For example, when the paper surface is rotated by 180 degrees, it is obvious that "upper" turns to "lower", and "lower" turns to "upper".

Additionally, in the following description, directions may be described using the terms "X axis direction", "Y axis direction", and "Z axis direction". For example, the X axis direction and the Y axis direction are directions parallel to one surface 1a of a support substrate 1 to be described later. The Z axis direction is a thickness direction of a semiconductor element 100 to be described later. The X axis direction, the Y axis direction, and the Z axis direction are orthogonal to one another. In addition, in the following description, the term "planar view" means to view from a normal direction (i.e., the Z axis direction) of the one surface 1a of the support substrate 1.

Furthermore, the following description will exemplify a case where first conductivity type is n-type, and second conductivity type is p-type. However, the conductivity types may be selected in an opposite relationship, in which the first conductivity type may be p-type, and the second conductivity type may be n-type. Additionally, symbols "+" and "−" added to "p" and "n" indicate that respective semiconductor regions have a relatively high or low impurity concentration as compared with those without "+" and "−" However, it is not meant that the respective semiconductor regions with the same symbol "p" have exactly the same impurity concentration.

Embodiment 1

Figure 1:
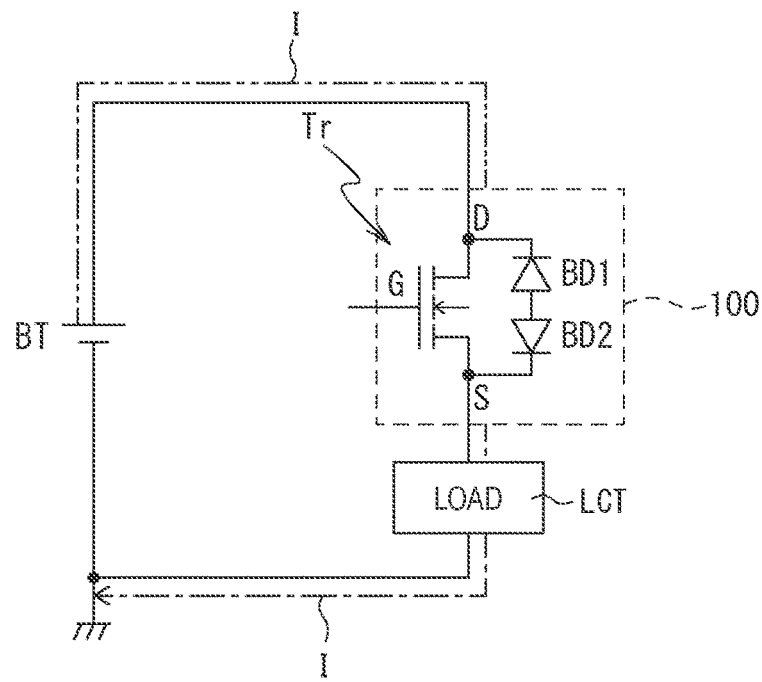
FIG. 1 is a circuit diagram illustrating a structural example of a semiconductor element according to Embodiment 1 of the present invention.

(Circuit Structure of Semiconductor Element) FIG. 1 is a circuit diagram illustrating a structural example of a semiconductor element according to Embodiment 1 of the present invention. A semiconductor element 100 according to Embodiment 1 of the present invention is, for example, a semiconductor switch that is connected between a power supply unit BT and a load LCT to prevent the load LCT from being broken due to reverse connection of the power supply unit BT. The term "reverse connection" means that a positive electrode and a negative electrode are connected reversely to normal. The load LCT can be any kind of load, and one example of the load LCT is an electronic control unit (ECU) that is installed in vehicles. FIG. 1 illustrates an example in which the positive and negative electrodes of the power supply unit BT are properly connected (i.e., normally connected) to the load LCT.

As illustrated in FIG. 1, the semiconductor element 100 includes a MOS transistor Tr. The MOS transistor Tr is an n-channel type power MOSFET designed to handle large electric power. The MOS transistor Tr includes a first body diode BD1 and a second body diode BD2.

The first body diode BD1 is incorporated in the MOS transistor Tr. The first body diode BD1 is a parasitic diode formed between a well region 31 (see FIG. 4 and FIG. 5) and a drift region 21 (see FIG. 4 and FIG. 5), both of which will be described later. A forward direction of the first body diode BD1 is a direction from a source S of the MOS transistor Tr toward a drain D thereof. In other words, the first body diode BD1 includes the well region 31 and the drift region 21, and is electrically connected to a back surface electrode 11. The second body diode BD2 also is incorporated in the MOS transistor Tr. The second body diode BD2 is a parasitic diode formed between the well region 31 and a source region 8 (see FIG. 4 and FIG. 5). A forward direction of the second body diode BD2 is a direction from the drain D of the MOS transistor Tr toward the source S thereof. In other words, the second body diode BD2 includes the well region 31 and the source region 8, and is electrically connected to a source electrode SE. The forward directions of the first body diode BD1 and the second body diode BD2 are reverse to each other. An anode of the first body diode BD1 and an anode of the second body diode BD2 are connected to each other.

In an n-channel type MOSFET, usually, the drain is connected to a high potential side, and the source is connected to a low potential side. For example, the drain D of the MOS transistor Tr is connected to the positive electrode of the power supply unit BT, and the source S of the MOS transistor Tr is connected to a power supply input terminal of the load LCT. In a current path from the power supply unit BT to the load LCT, the first body diode BD1 is reversely connected, and the second body diode BD2 is forwardly connected. A gate G of the MOS transistor Tr is connected to a control element (unillustrated). Turning on and off (i.e., a drain D-to-source S conduction state) of the MOS transistor Tr is controlled by the control element.

(Circuit Operation of Semiconductor Element)

When the power supply unit BT is normally connected to the load LCT, the control element transmits a voltage signal for turning on the gate G to the MOS transistor Tr. As a result, as indicated by a two-dot chain line of FIG. 1, a current I flows from the power supply unit BT to the load LCT through the MOS transistor Tr. On the other hand, when the positive and negative electrodes of the power supply unit BT are improperly connected (i.e., reversely connected) to the load LCT, the potential of the source S is increased by the power supply unit BT. Thus, even if the gate G is turned on and voltage is applied to operate the MOS transistor Tr, the applied voltage applied between the gate G and the source S becomes small. Due to this, the current I cannot flow sufficiently or the MOS transistor Tr cannot operate. In the case of reverse connection, the first body diode BD1 is forward connected, whereas the second body diode BD2 is reversely connected. As a result, the semiconductor element 100 can shut down current both in a path passing through the MOS transistor Tr and in a path passing through the first body diode BD1 and the second body diode BD2.

It is the control element that detects whether or not the power supply unit BT is reversely connected to the load LCT. For example, when the power supply unit BT is reversely connected to the load LCT, the source potential of the MOS transistor Tr becomes higher than that in normal connection, and becomes substantially the same potential as that of the positive electrode of the power supply unit BT. The control element detects the source potential of the MOS transistor Tr and compares the detected value with a preset control value, thereby enabling a determination to be made as to whether or not the power supply unit BT is reversely connected to the load LCT.

Additionally, the control element detects abnormality of the semiconductor element 100 not only when in reverse connection but also even when in normal connection. Then, upon detection of abnormality in the semiconductor element 100, the control element transmits a voltage signal for turning off the gate G to the MOS transistor Tr. For example, when the current I flowing in the semiconductor element 100 exceeds the preset control value, the control element transmits a voltage signal for turning off the gate G to the MOS transistor Tr. By doing this, the semiconductor element 100 can shut down current both in the path passing through the MOS transistor Tr and in the path passing through the first body diode BD1 and the second body diode BD2.

(Structure of Semiconductor Element)

Figure 2:
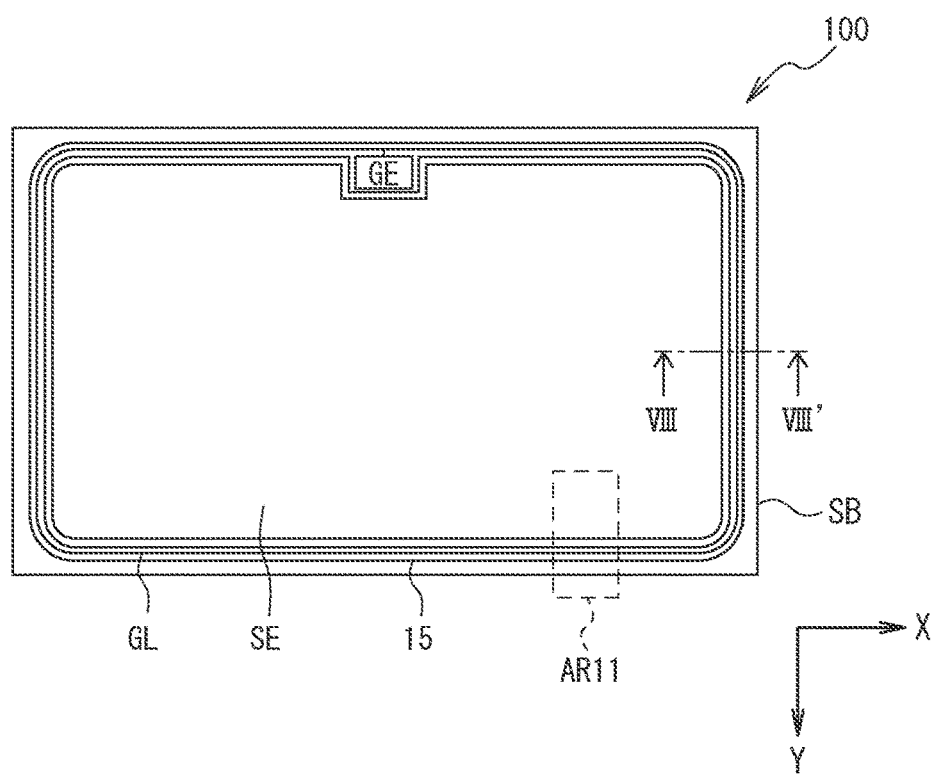
FIG. 2 is a plan view illustrating the structural example of the semiconductor element according to Embodiment 1 of the present invention.
Figure 3:
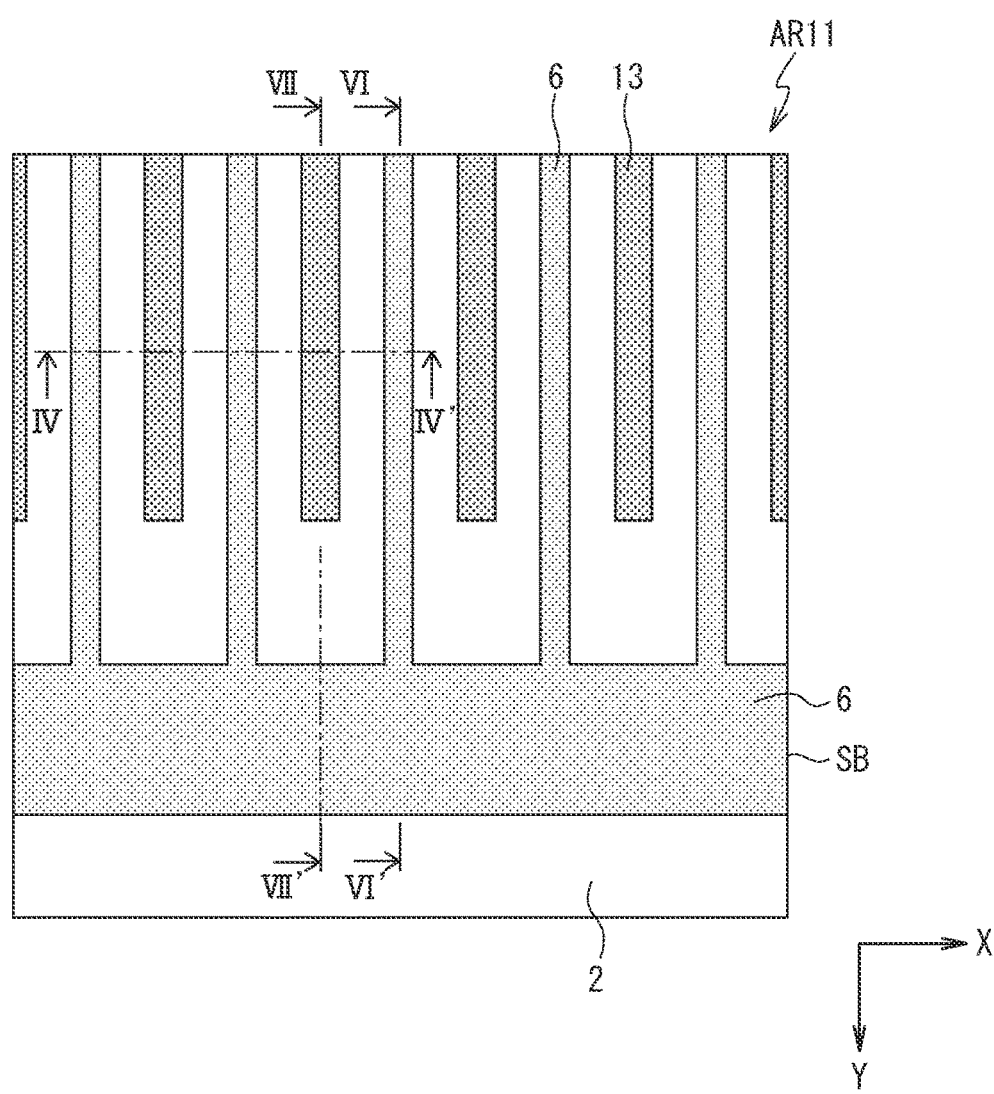
FIG. 3 is a plan view illustrating a structural example of a region including an active region and an outer peripheral portion of the semiconductor element according to Embodiment 1 of the present invention.
Figure 4:
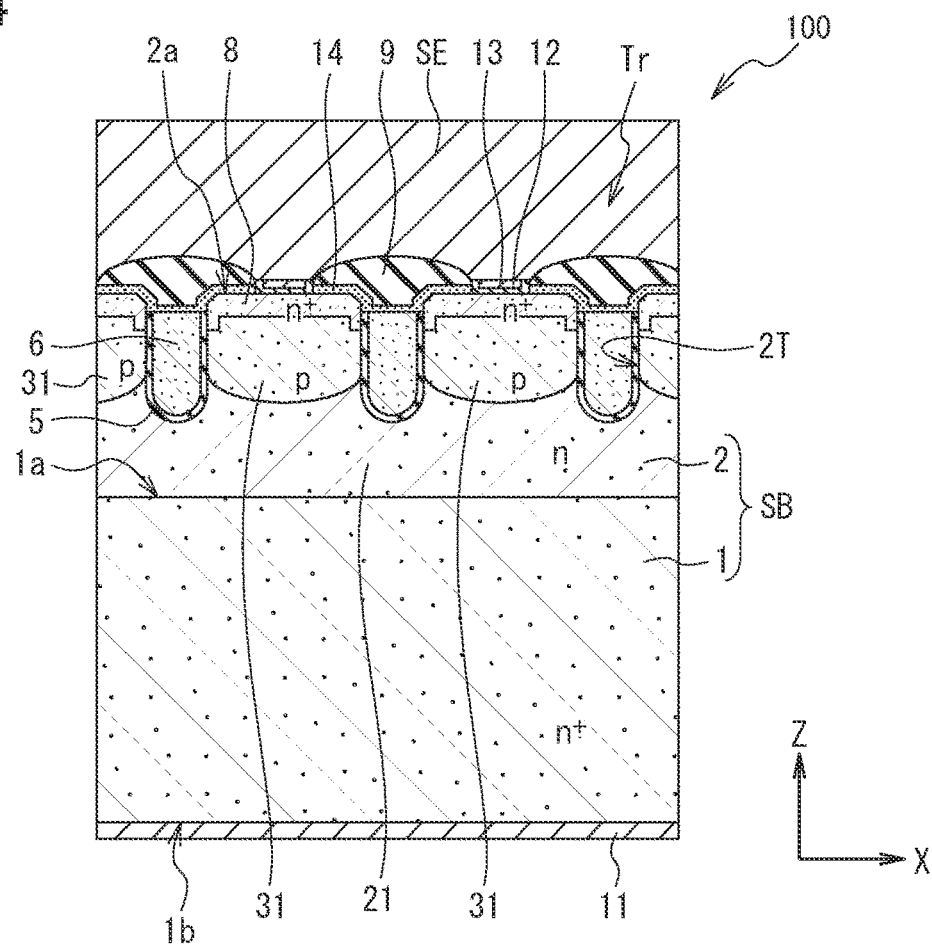
FIG. 4 is a cross-sectional view taken along line IV-IV' of the plan view illustrated in FIG. 3.
Figure 5:
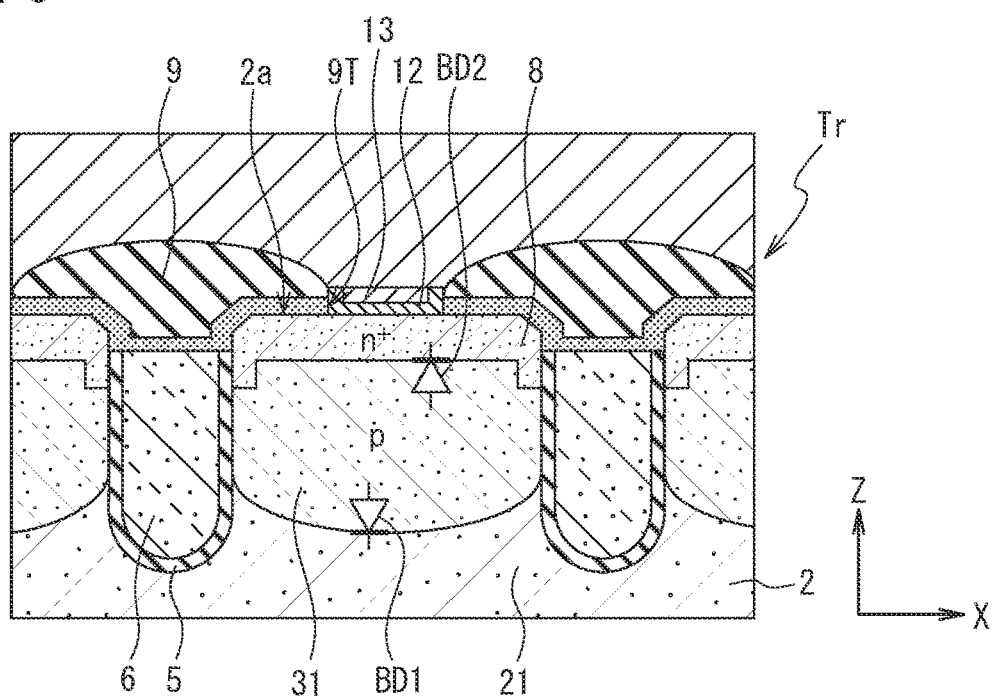
FIG. 5 is a cross-sectional view illustrating a MOS transistor illustrated in FIG. 4 in an enlarged manner.
Figure 6:
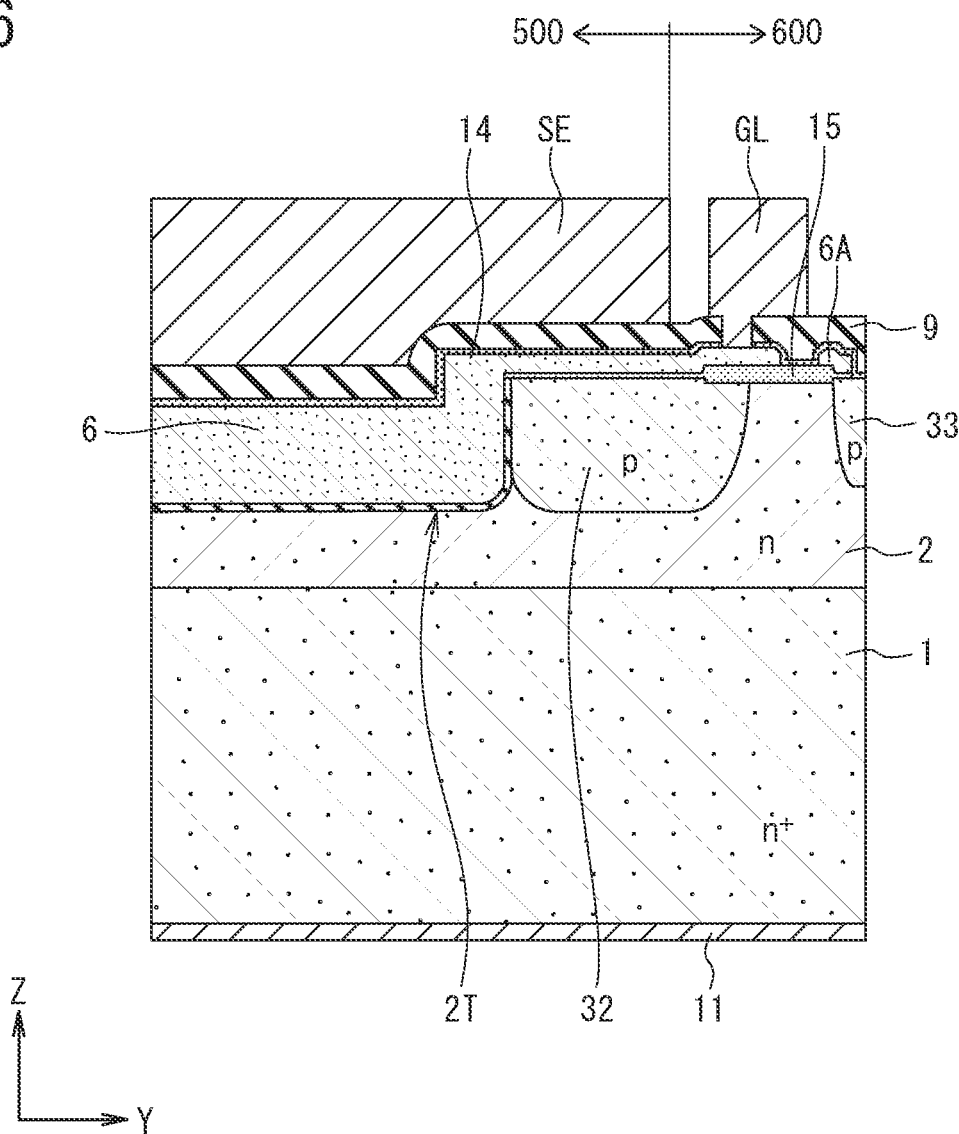
FIG. 6 is a cross-sectional view taken along line VI-VI' of the plan view illustrated in FIG. 3.
Figure 7:
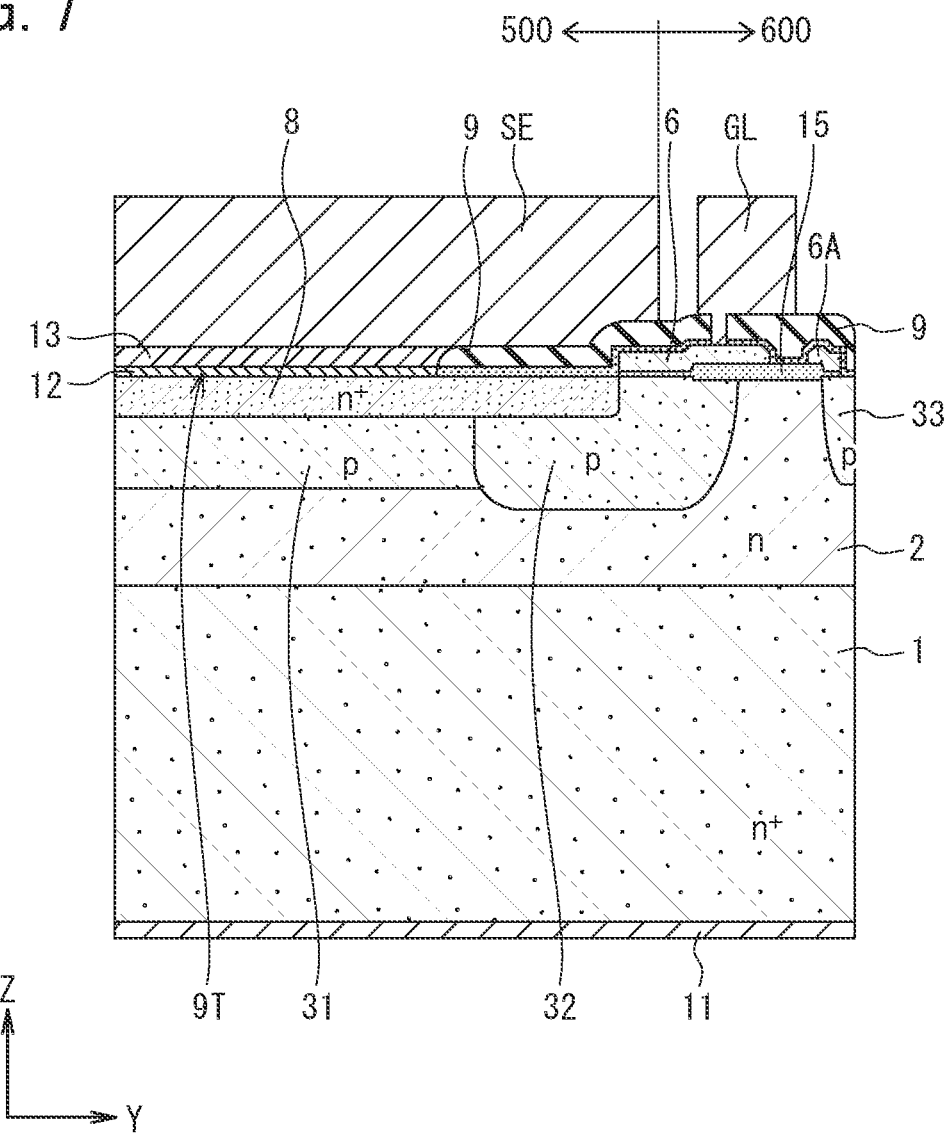
FIG. 7 is a cross-sectional view taken along line VII-VII' of the plan view illustrated in FIG. 3.
Figure 8:
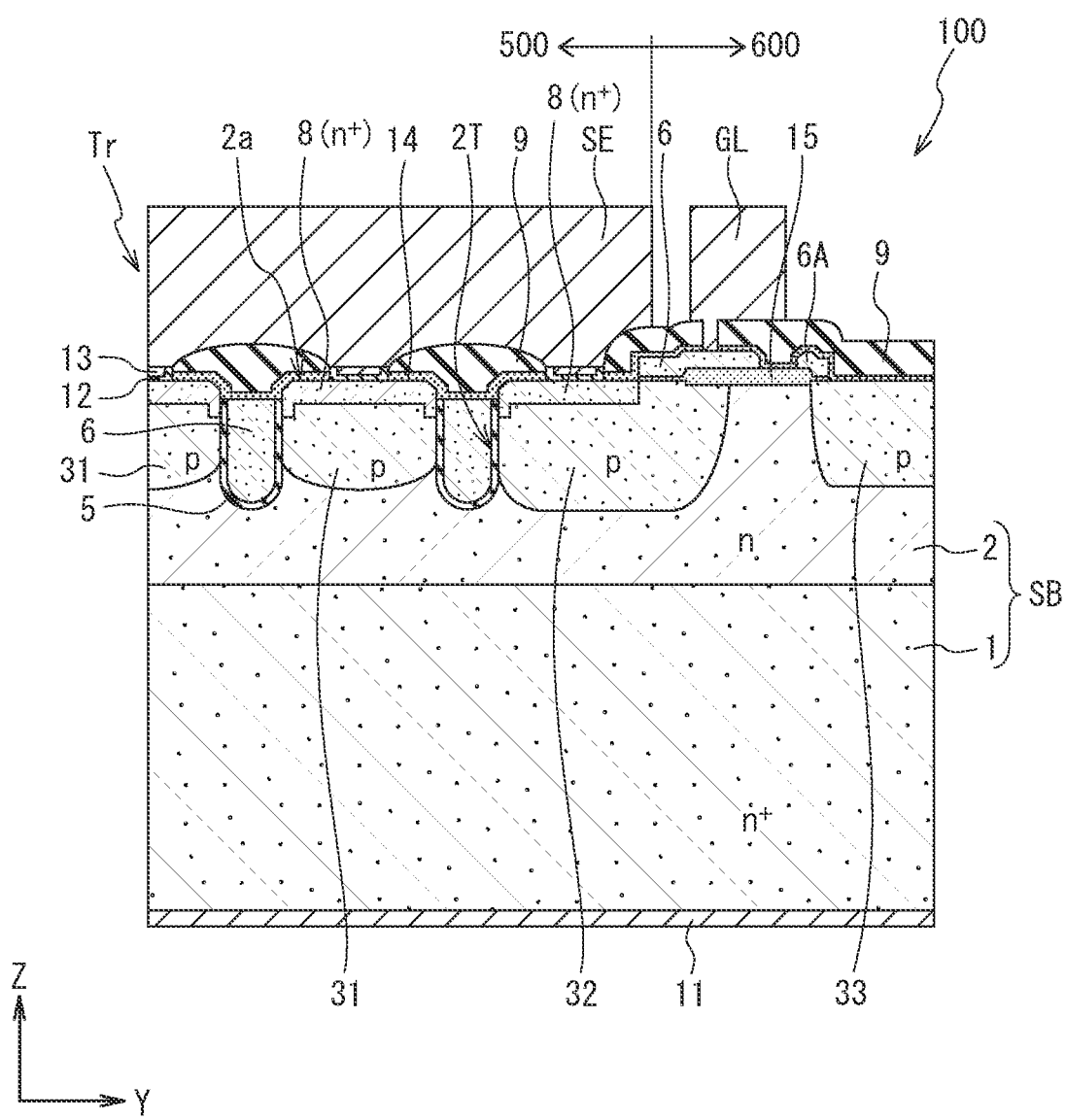
FIG. 8 is a cross-sectional view taken along line VIII-VIII' of the plan view illustrated in FIG. 2.

FIG. 2 is a plan view illustrating a structural example of the semiconductor element according to Embodiment 1 of the present invention. FIG. 3 is a plan view illustrating a structural example of a region including an active region and an outer peripheral portion of the semiconductor element according to Embodiment 1 of the present invention. FIG. 3 illustrates a region AR11 surrounded by a broken line of FIG. 2 in an enlarged manner, where illustrations of an interlayer insulating film 9 and the source electrode SE are omitted. FIG. 4 is a cross-sectional view taken along line IV-IV' of the plan view illustrated in FIG. 3. FIG. 5 is a cross-sectional view illustrating a MOS transistor illustrated in FIG. 4 in an enlarged manner. FIG. 6 is a cross-sectional view taken along line VI-VI' of the plan view illustrated in FIG. 3. FIG. 7 is a cross-sectional view taken along line VII-VII' of the plan view illustrated in FIG. 3. FIG. 8 is a cross-sectional view taken along line VIII-VIII' of the plan view illustrated in FIG. 2.

As illustrated in FIG. 2 to FIG. 8, the semiconductor element 100 according to Embodiment 1 includes a semiconductor substrate SB. The MOS transistor Tr is provided on the semiconductor substrate SB. For example, the semiconductor substrate SB includes the support substrate 1 and a semiconductor layer 2 formed on one surface (hereinafter referred to as front surface) 1a of the support substrate 1. The support substrate 1 is a single crystal Si substrate made of silicon (Si). The semiconductor layer 2 is a single crystal Si layer formed by an epitaxial growth process on the one surface (for example, front surface) 1a of the support substrate 1. The support substrate 1 and the semiconductor layer 2, respectively, are n-type semiconductors including an n-type impurity such as phosphorus (P). The support substrate 1 has a higher n-type impurity concentration than that of the semiconductor layer 2. The support substrate 1 is an n+ region, and the semiconductor layer 2 is an n region.

The support substrate 1 may have a thickness of, for example, from 40 μm to 260 μm, and the semiconductor layer 2 may have a thickness of, for example, from 4 μm to 15 μm. The thinner the thickness of the support substrate 1, the more improved the electric characteristics. However, as the thickness of the support substrate 1 becomes thinner, it becomes more difficult to handle it in a manufacturing process, which can reduce productivity and non-defective product rate of the semiconductor element. The thickness of the semiconductor layer 2 varies depending on the voltage of the power supply unit BT, and needs to be a thickness that can maintain a breakdown voltage equal to or higher than the voltage of the connected power supply unit BT.

In addition, the support substrate 1 may have an impurity concentration of, for example, from $1\times10^{19}$/cm$^3$ to $1\times10^{20}$/cm$^3$. The semiconductor layer 2 may have an impurity concentration of, for example, from $2\times10^{15}$/cm$^3$ to $2\times10^{17}$/cm$^3$. The impurity concentration of the semiconductor layer 2 varies depending on the voltage of the power supply unit BT, and needs to be an impurity concentration that can provide a breakdown voltage equal to or higher than the voltage of the connected power supply unit BT and that can provide a desired on-resistance.

Assume that an active region 500 of the semiconductor element is a region provided with the source electrode SE to be described later, and an outer peripheral portion 600 of the semiconductor element is a region located outside the source electrode SE.

As illustrated in FIG. 4 and FIG. 5, the semiconductor layer 2 is provided with a p-type well region 31 including a p-type impurity such as boron (B). The well region 31 is provided in the active region 500 of the semiconductor element 100. The active region 500 is a region provided with the MOS transistor Tr. The active region 500 may also be referred to as element region. Additionally, as illustrated in FIG. 6 to FIG. 8, the semiconductor layer 2 is provided with a p-type resurf region 32 and a p-type channel stopper region 33. The resurf region 32 is formed to straddle the active region 500 and the outer peripheral portion 600 of the semiconductor element 100. The channel stopper region 33 is formed on the outer peripheral portion 600 of the semiconductor element 100. The outer peripheral portion 600 of the semiconductor element 100 is a region surrounding the active region 500 in a planar view.

The well region 31 and the channel stopper region 33 have mutually the same depth from one surface (hereinafter referred to as front surface) 2a of the semiconductor layer 2. A depth of the resurf region 32 from the front surface 2a is deeper than the depth of the well region 31 from the front surface 2a. The resurf region 32 has a lower p-type impurity concentration than or substantially the same as the p-type impurity concentration of the well region 31.

As illustrated in FIG. 3 to FIG. 5, the MOS transistor Tr is a vertical MOS transistor with a trench gate structure. The MOS transistor Tr includes a trench 2T provided to penetrate through the p-type well region 31 from the front surface 2a of the semiconductor layer 2, a gate insulating film 5 provided along an inner wall of the trench 2T, a gate electrode 6 provided on the gate insulating film 5 and embedded in the trench 2T via the gate insulating film 5, an n-type source region (n' region) 8 provided on the well region 31, and an n-type drift region (n region) 21 provided under the well region 31. The drift region 21 is provided in the semiconductor layer 2.

The gate insulating film 5 covers a bottom face and a side face of the trench 2T provided in the semiconductor layer 2. The gate insulating film 5 is, for example, a silicon oxide (SiO$_2$) film. Additionally, the gate electrode 6 is embedded in the trench 2T via the gate insulating film 5. In addition, a part of the gate electrode 6 is drawn out onto the semiconductor layer 2 covered with an insulating film, and is electrically connected to a gate wire GL. Ends of the part of the gate electrode 6 drawn out onto the semiconductor layer 2 are connected to each other. A portion where the ends of the gate electrode 6 drawn out onto the semiconductor layer 2 are connected to each other may be provided in such a manner as to surround the active region 500 of the semiconductor element 100 in a planar view. The gate electrode 6 is formed by, for example, a polysilicon (poly-Si) film. Note that the gate wire GL illustrated in FIG. 2 is indicated by a single line to simplify the drawing.

An insulating film 14 is provided on the gate electrode 6. The insulating film 14 is a high temperature silicon oxide film (HTO: high temperature oxide). Additionally, the interlayer insulating film 9 is provided on the insulating film 14. The interlayer insulating film 9 is a boron- and phosphorus-containing silicon oxide film (BPSG film).

Additionally, in the insulating film 14 and the interlayer insulating film 9 above the well region 31 is provided a plug electrode 13 connected to the source region 8. For example, as illustrated in FIG. 5, a contact 9T having the source region 8 as a bottom face thereof is provided in the insulating film 14 and the interlayer insulating film 9. A barrier metal 12 is provided on the bottom face and a side face of the contact 9T. In addition, the plug electrode 13 is embedded in the contact 9T via the barrier metal 12. As a result, the plug electrode 13 is electrically connected to the source region 8 via the barrier metal 12.

The source electrode SE is provided on the interlayer insulating film 9 and the plug electrode 13. The source electrode SE is connected to the plug electrode 13. As illustrated in FIG. 2, a shape in a planar view (hereinafter referred to as planar shape) of the source electrode SE is, for example, a rectangular shape. The rectangular shape may have one or more rounded corners. The source electrode SE is provided in the active region 500 of the semiconductor element 100. Additionally, a gate electrode pad GE is provided in the outer peripheral portion 600 of the semiconductor element 100. The planar shape of the gate electrode pad GE is, for example, a rectangular shape. The source electrode SE has a larger area than an area of the gate electrode pad GE.

On the other surface (hereinafter referred to as back surface) 1b of the support substrate 1 is provided a back surface electrode 11. The back surface electrode 11 may be, for example, a conductive film made of an aluminum alloy whose main component is aluminum, gold, or the like, or may be a laminated film made thereof.

Note that the source electrode SE corresponds to the source S of the MOS transistor Tr illustrated in FIG. 1. The gate electrode pad GE corresponds to the gate G of the MOS transistor Tr illustrated in FIG. 1. The back surface electrode 11 corresponds to the drain D of the MOS transistor Tr illustrated in FIG. 1.

As illustrated in FIG. 6 to FIG. 8, on the outer peripheral portion 600 of the semiconductor element 100 are provided a part of the resurf region 32, the channel stopper region 33, a LOCOS (local oxidation of silicon) film 15, the gate electrode 6 drawn out onto the semiconductor layer 2, a field plate 6A, and the gate wire GL. The gate wire GL is a wire electrically connecting the gate electrode 6 to the gate electrode pad GE. The gate wire GL is provided on the interlayer insulating film 9. The gate wire GL is connected to the gate electrode 6 via a contact hole provided on the interlayer insulating film 9. As illustrated in FIG. 2, the LOCOS film 15 and the gate wire GL surround the active region 500 of the semiconductor element 100 in a planar view.

The field plate 6A is formed by, for example, a polysilicon (poly-Si) film. The field plate 6A is formed in the same layer as that of the gate electrode 6, and is formed simultaneously with the gate electrode 6 in the same step. Note that the gate electrode 6 and the field plate 6A are electrically separated, and fixed at each different potential. For example, the gate electrode 6 is fixed at a gate potential for turning on and off the MOS transistor Tr. The field plate 6A is fixed at a drain potential. The insulating film 14 is provided also on the field plate 6A, like the gate electrode 6.

The gate wire GL not only serves as a wire, but also serves as a field plate of metal. In addition, besides the field plate 6A, the gate electrode 6 drawn out onto the semiconductor layer 2 also serves as a field plate of polysilicon. The field plate of metal and the field plate of polysilicon can reduce electric field intensity of the front surface 2a of the semiconductor layer 2 and in the vicinity thereof, and serve to facilitate horizontal extension of a depletion layer formed on the front surface 2a of the semiconductor layer 2 and in the vicinity thereof. This can increase a breakdown voltage of the outer peripheral portion 600 of the semiconductor element 100.

In addition, while the well region 31 is formed to be shallower than the trench 2T, the resurf region 32 is formed to be deeper than the trench 2T. As a result, the resurf region 32 can extend the depletion layer more widely both in the horizontal direction and in the depthwise direction, as compared with a case where the resurf region 32 is formed to have the same depth as that of the well region 31. By doing this, the breakdown voltage of the outer peripheral portion 600 of the semiconductor element 100 can be further increased.

Thus, in the outer peripheral portion 600 of the semiconductor element 100, the channel stopper region 33, the resurf region 32, the LOCOS film 15, and the field plate 6A serve as a high breakdown voltage structure portion. Additionally, in the outer peripheral portion 600 of the semiconductor element 100, the gate electrode 6 (the field plate of polysilicon) drawn out onto the semiconductor layer 2 and the gate wire GL also serve as a high breakdown voltage structure portion.

As illustrated in FIG. 3, the gate electrode 6 and the plug electrode 13, respectively, are extended in one direction (for example, the Y axis direction). Additionally, the gate electrode 6 and the plug electrode 13 are alternately arranged in an other direction (for example, the X axis direction) orthogonal to the one direction in a planar view. The gate electrode 6 is extended from the active region 500 of the semiconductor element 100 to the outer peripheral portion 600 thereof. As illustrated in FIG. 6, the gate electrode 6 is drawn out onto the semiconductor layer 2 at the outer peripheral portion 600 of the semiconductor element 100. As described above, the gate electrode 6 drawn out from the trench 2T onto the semiconductor layer 2 serves as the field plate of polysilicon. On the other hand, the plug electrode 13 is formed only in the active region 500 of the semiconductor element 100, and is not extended to the outer peripheral portion 600 thereof. As illustrated in FIG. 7, the plug electrode 13 is formed only in the contact 9T.

As described hereinabove, the semiconductor element 100 according to Embodiment 1 of the present invention is a semiconductor element for use in a semiconductor switch for protecting an electric circuit, and includes the semiconductor substrate SB, the field effect transistor (for example, the MOS transistor Tr) provided on the semiconductor substrate SB, and a first electrode (for example, the source electrode SE) provided on one surface (for example, the front surface 2a) side of the semiconductor substrate SB. The MOS transistor Tr includes the electrode region (for example, the source region 8) of a first conductivity type (for example, n-type) connected to the source electrode SE, the drift region 21 of the n-type arranged away from the source region 8, and the well region 31 of a second conductivity type (for example, p-type) arranged between the source region 8 and the drift region 21. The source region 8 is interposed between the source electrode SE and the well region 31.

As a result, the first body diode BD1 is formed between the drift region 21 and the well region 31. The second body diode BD2 is formed between the well region 31 and the source region 8. The first body diode BD1 and the second body diode BD2 are connected in series to each other. Additionally, the forward direction of the first body diode BD1 is reverse to the forward direction of the second body diode BD2. The first body diode BD1 and the second body diode BD2 are arranged between the source electrode SE provided on the front surface 2a side of the semiconductor substrate SB and a second electrode provided on the back surface 1b side of the semiconductor substrate SB.

Thus, when the positive electrode and negative electrode of the power supply unit BT are reversely connected to the load LCT, one of connections of the first body diode BD1 and the second body diode BD2 to the power supply unit BT becomes forward connection, and the other connection thereof becomes reverse connection. This leads to shut down of the current path passing through the first body diode BD1 and the second body diode BD2. As a result, the semiconductor element 100 can prevent the load LCT from being broken due to the reverse connection of the power supply unit BT.

In the present embodiment, the single MOS transistor Tr is used to form the semiconductor switch. Thus, as compared with cases where two or more MOS transistors are used to form a semiconductor switch, the semiconductor element 100 can be miniaturized. In addition, the number of the MOS transistors Tr forming the current path in the semiconductor element 100 is one. Thus, as compared with the use of two or more MOS transistors to form a semiconductor switch, on-resistance of the semiconductor element 100 can be reduced.

Additionally, the semiconductor element 100 further includes the barrier metal 12 and the plug electrode 13 provided between the source electrode SE and the source region 8. This can increase adhesion between the source electrode SE and the source region 8, whereby the source electrode SE and the source region 8 can be connected in ohmic contact. In addition, the semiconductor element 100 further includes the second electrode (for example, the back surface electrode 11) provided on the other surface (for example, the back surface 1b) of the semiconductor substrate SB. By doing this, the semiconductor element 100 allows current to flow between the source electrode SE and the back surface electrode 11. The semiconductor element 100 allows current to flow in a thickness direction of the semiconductor substrate SB.

Modification 1

Figure 9:
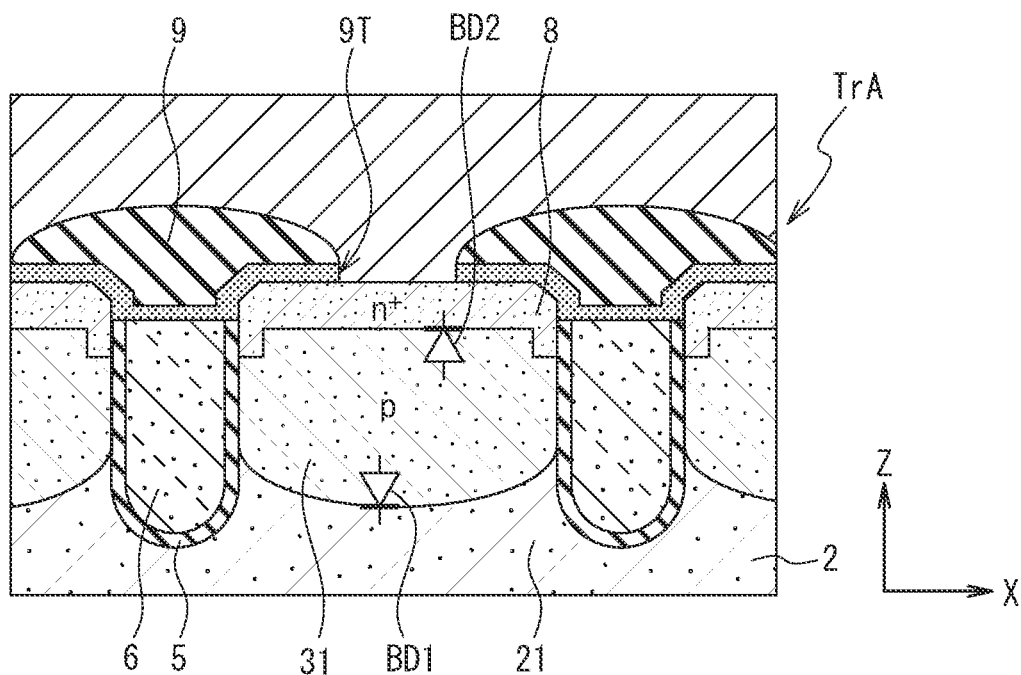
FIG. 9 is a cross-sectional view illustrating a structure of a MOS transistor according to Modification 1 of Embodiment 1 of the present invention.

In Embodiment 1 described above, it has been described that the source region 8 and the source electrode SE are electrically connected via the barrier metal 12 and the plug electrode 13. However, the present embodiment is not limited thereto. FIG. 9 is a cross-sectional view illustrating a structure of a MOS transistor according to Modification 1 of Embodiment 1 of the present invention. As illustrated in FIG. 9, in a MOS transistor TrA according to Modification 1 of Embodiment 1 of the present invention, the barrier metal 12 and the plug electrode 13 are not present between the source region 8 and the source electrode SE. In the MOS transistor TrA, the source region 8 and the source electrode SE are in direct contact. Even in such a structure, the source region 8 and the source electrode SE can be electrically connected. Additionally, even when the barrier metal 12 and the plug electrode 13 are not interposed between the source region 8 and the source electrode SE, the source region 8 and the source electrode SE can be connected in ohmic contact depending on combinations of materials of the source region 8 and the source electrode SE.

Modification 2

Figure 10:
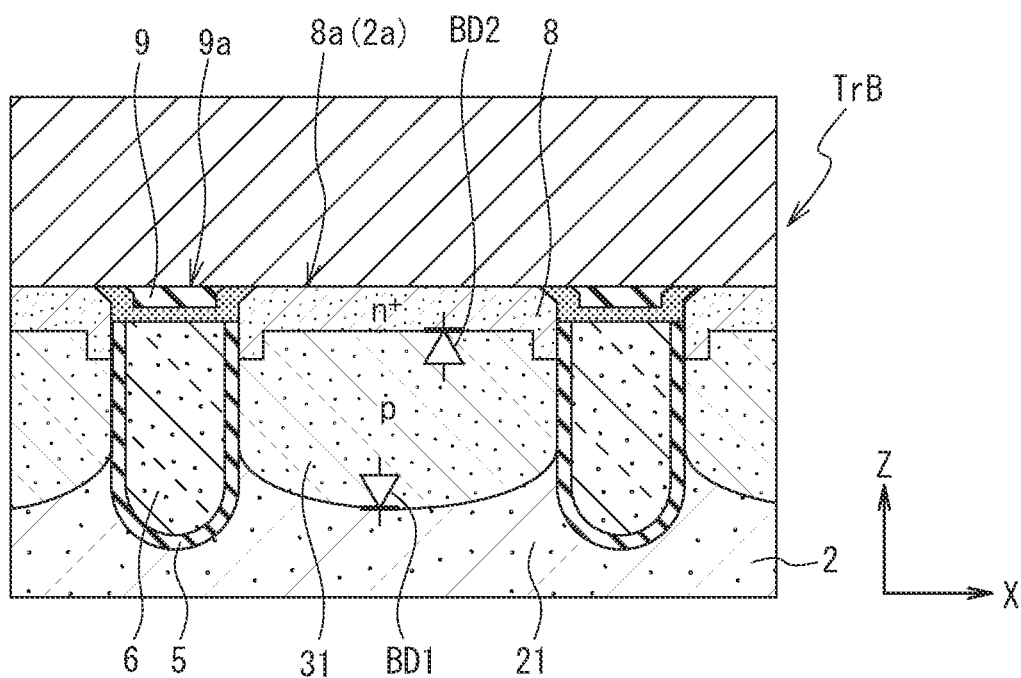
FIG. 10 is a cross-sectional view illustrating a structure of a MOS transistor according to Modification 2 of Embodiment 1 of the present invention.

FIG. 10 is a cross-sectional view illustrating a structure of a MOS transistor according to Modification 2 of Embodiment 1 of the present invention. As illustrated in FIG. 10, in a MOS transistor TrB according to Modification 2 of Embodiment 1, an upper surface of the interlayer insulating film 9 is flattened. An upper surface 9a of the interlayer insulating film 9 and an upper surface 8a of the source region 8 are positioned at the same height or substantially the same height. The supper surface 9a of the interlayer insulating film 9 is flush or substantially flush with the upper surface 8a of the source region 8. Such a structure would be able to increase flatness of the source electrode SE formed on the interlayer insulating film 9 and on the source region 8. Note that the structure illustrated in FIG. 10 can be formed, for example, by forming the interlayer insulating film 9 and then etching back the interlayer insulating film 9 until the upper surface 8a of the source region 8 is exposed.

Modification 3

Figure 11:
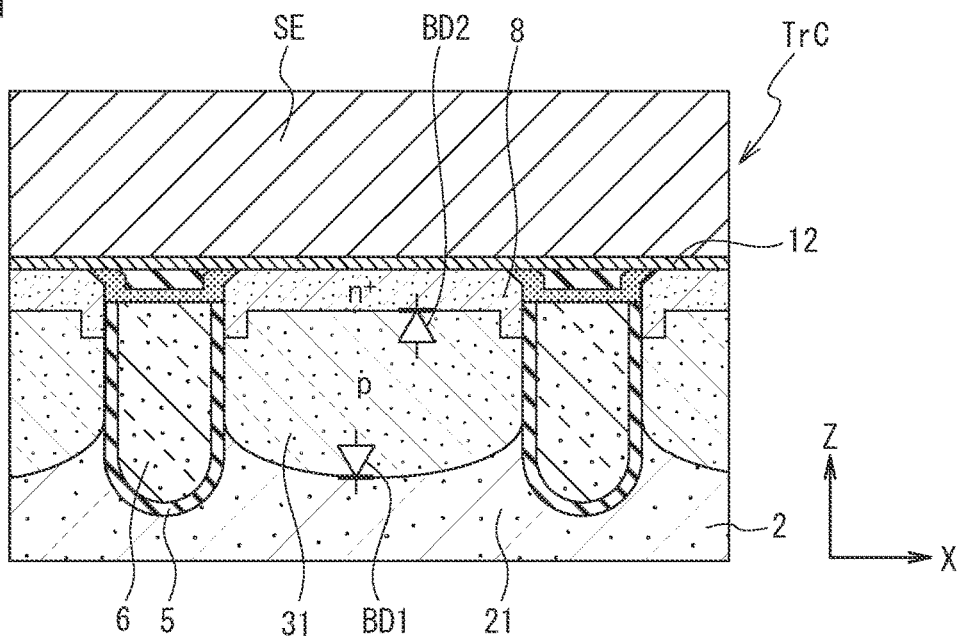
FIG. 11 is a cross-sectional view illustrating a structure of a MOS transistor according to Modification 3 of Embodiment 1 of the present invention.

FIG. 11 is a cross-sectional view illustrating a structure of a MOS transistor according to Modification 3 of Embodiment 1 of the present invention. As illustrated in FIG. 11, a MOS transistor TrC according to Modification 3 of Embodiment 1 has a structure in which the barrier metal 12 is provided on the interlayer insulating film 9 and on the source region 8 in the above-described MOS transistor TrB. Even in such a structure, the barrier metal 12 is formed to be flat, so that the flatness of the source electrode SE can be increased. Additionally, the MOS transistor TrC includes the barrier metal 12 between the source electrode SE and the source region 8, so that the adhesion between the source electrode SE and the source region 8 can be increased, whereby the source electrode SE and the source region 8 can be connected in ohmic contact.

Embodiment 2

Figure 12:
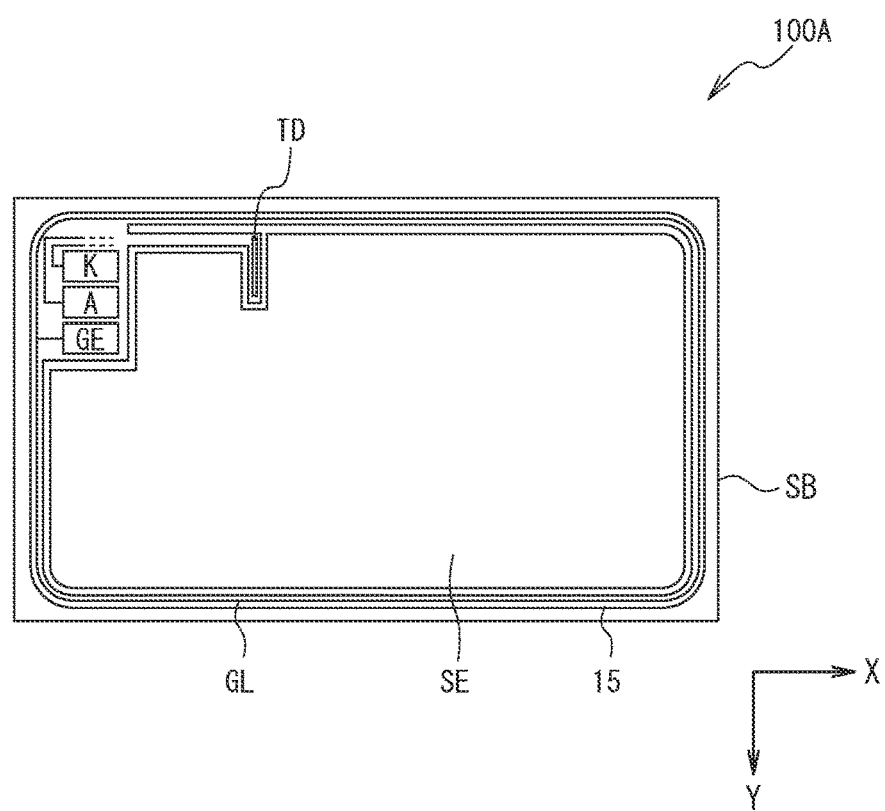
FIG. 12 is a plan view illustrating a structure of a semiconductor element according to Embodiment 2 of the present invention.
Figure 13:
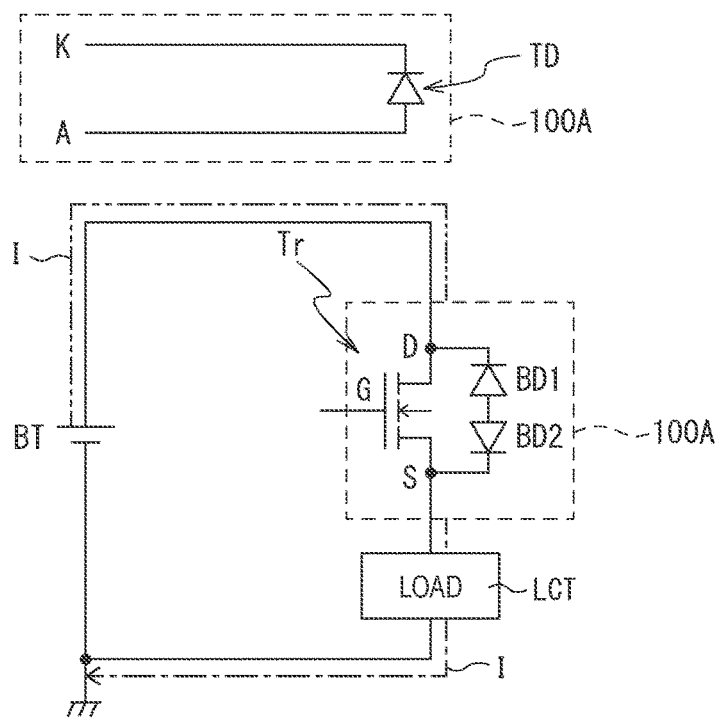
FIG. 13 is a circuit diagram illustrating a structural example of the semiconductor element according to Embodiment 2 of the present invention.
Figure 14:
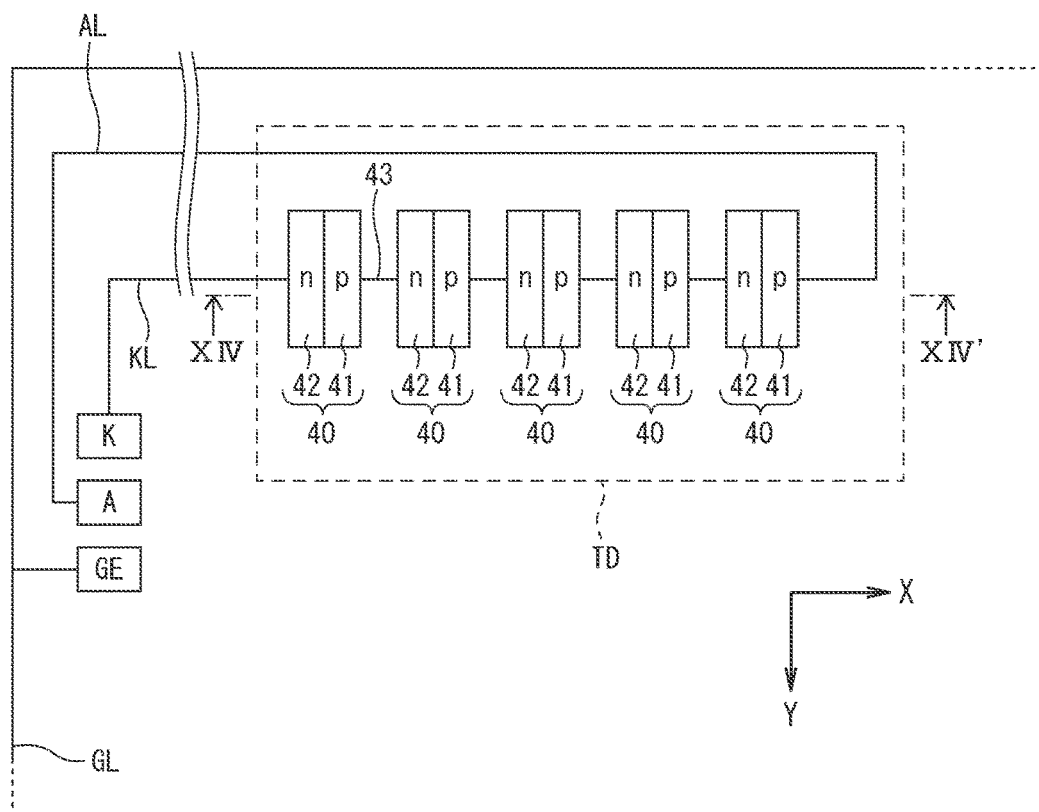
FIG. 14 is a plan view illustrating a structural example of a temperature detecting element according to Embodiment 2 of the present invention.
Figure 15:
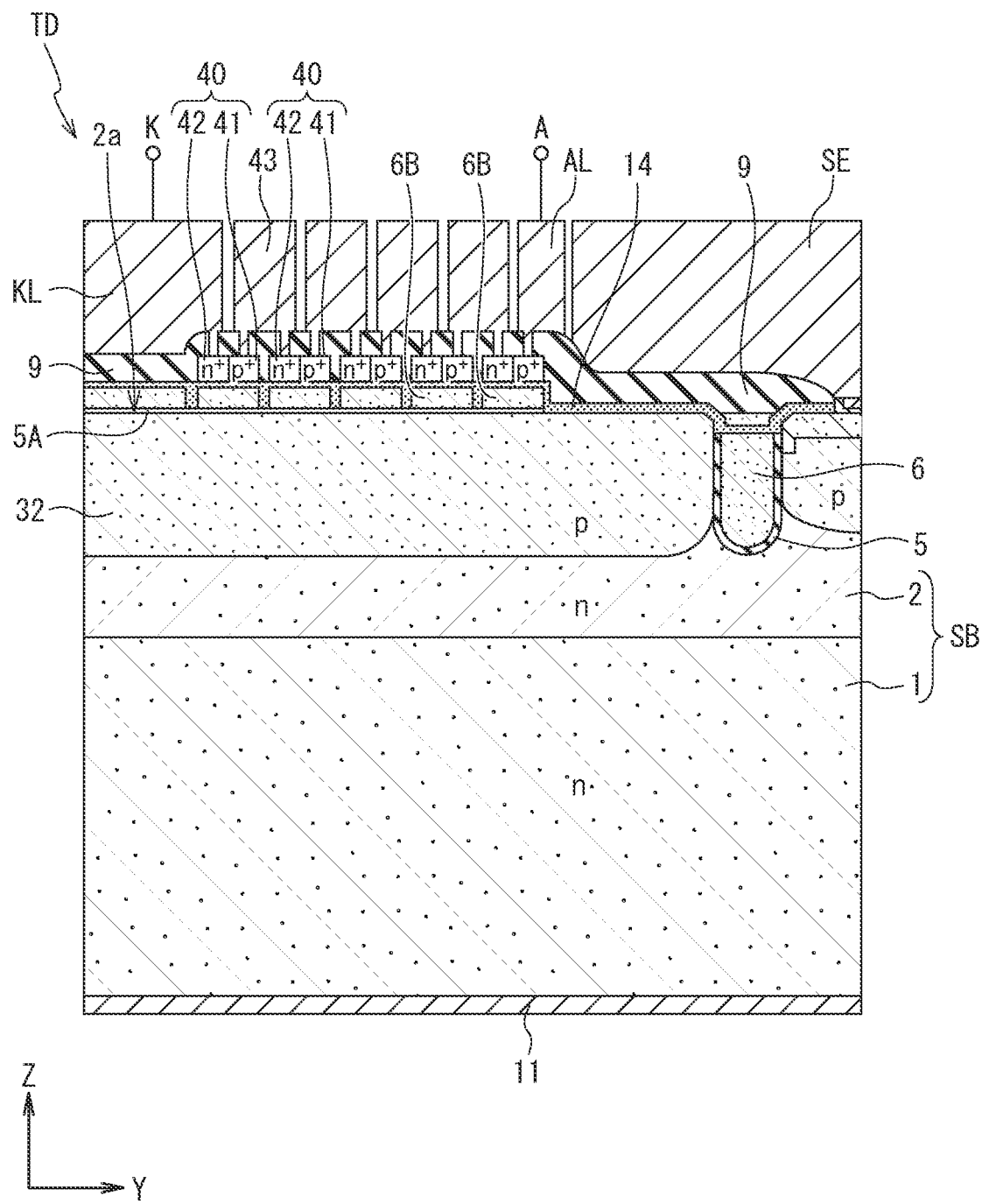
FIG. 15 is a cross-sectional view illustrating the structural example of the temperature detecting element according to Embodiment 2 of the present invention.

FIG. 12 is a plan view illustrating a structure of a semiconductor element according to Embodiment 2 of the present invention. FIG. 13 is a circuit diagram illustrating a structural example of the semiconductor element according to Embodiment 2 of the present invention. FIG. 14 is a plan view illustrating a structural example of a temperature detecting element according to Embodiment 2 of the present invention. FIG. 15 is a cross-sectional view illustrating the structural example of the temperature detecting element according to Embodiment 2 of the present invention. FIG. 15 corresponds to a cross section taken along line XIV-XIV' of the plan view illustrated in FIG. 14. A semiconductor element 100A according to Embodiment 2 of the present invention further includes the temperature detecting element configured to detect temperature of the semiconductor substrate SB in the semiconductor element 100 according to Embodiment 1 of the present invention. Note that the gate wire GL illustrated in FIG. 12 is indicated by a single line to simplify the drawing.

As illustrated in FIG. 12 to FIG. 15, the semiconductor element 100A according to Embodiment 2 includes a temperature detecting element TD, an anode electrode pad A, an anode wire AL, a cathode electrode pad K, and a cathode wire KL. The temperature detecting element TD, the anode electrode pad A, the anode wire AL, the cathode electrode pad K, and the cathode wire KL, respectively, are provided on the front surface 2a side of the semiconductor substrate SB.

As illustrated in FIG. 12, the temperature detecting element TD is included in the semiconductor element 100A. However, the temperature detecting element TD is not connected to the MOS transistor Tr, as illustrated in the circuit diagram of FIG. 13.

As illustrated in FIG. 14 and FIG. 15, the temperature detecting element TD has a structure in which a plurality of p-n junction diodes is connected in series. The temperature detecting element TD includes a first conductivity type layer (for example, a plurality of n-type semiconductor layers 42) and a second conductivity type layer (for example, a plurality of p-type semiconductor layers 41) connected to the first conductivity type layer. A pair of one p-type semiconductor layer 41 and one n-type semiconductor layer 42 joined together forms one p-n junction diode 40.

In addition, the adjacent p-n junction diodes 40 are connected to each other via a relay electrode 43. For example, the p-type semiconductor layer 41 of one of the adjacent two p-n junction diodes 40 is electrically connected to the n-type semiconductor layer 42 of the other p-n junction diode 40 via the relay electrode 43. In this manner, the plurality of p-n junction diodes 40 is connected in series to form the temperature detecting element TD. An anode-side end portion of the temperature detecting element TD is connected to the anode electrode pad A via the anode wire AL. A cathode-side end portion of the temperature detecting element TD is connected to the cathode electrode pad K via the cathode wire KL.

As illustrated in FIG. 15, an insulating film 5A, the insulating film 14, and a semiconductor film 6B are provided between the p-n junction diodes 40 forming the temperature detecting element TD and the p-type resurf region 32. The insulating film 5A is provided on the resurf region 32. The semiconductor film 6B is provided on the insulating film 5A. Additionally, the insulating film 14 covers an upper surface and side faces of the semiconductor film 6B. For example, the insulating film 5A is formed simultaneously with the gate insulating film 5 in the same step. The insulating film 5A is an $SiO_2$ film. The semiconductor film 6B is formed simultaneously with the gate electrode 6 in the same step. The semiconductor film 6B is polysilicon doped with an impurity such as phosphorus. The semiconductor film 6B is not electrically connected to anywhere, and is at floating potential.

The semiconductor film 6B is provided against surge of the temperature detecting element TD. The semiconductor film 6B has a thickness of, for example, from 200 nm to 1000 nm. In addition to the insulating films 5A and 14, the semiconductor film 6B that is a thick film is provided under the p-n junction diodes 40, so that insulation characteristics between the p-n junction diodes 40 and the resurf region 32 are further improved.

The control element (unillustrated) configured to control turning on and off of the MOS transistor Tr included in the semiconductor element 100A can detect current-voltage characteristics of the temperature detecting element TD via the anode electrode pad A and the cathode electrode pad K. Additionally, forward current-voltage characteristics of the temperature detecting element TD correlate with temperature. The temperature detecting element TD is characterized in that as temperature increases, voltage decreases with respect to current flowing forward. Thus, the control element can detect temperature of the temperature detecting element TD and in a vicinity thereof by detecting the current-voltage characteristics of the temperature detecting element TD.

When the temperature detected by the temperature detecting element TD exceeds a preset control value, the control element transmits a voltage signal for turning off the gate G to the MOS transistor Tr. As a result, the MOS transistor Tr is turned off, so that the semiconductor element 100A can shut down current. Since the semiconductor element 100A includes the temperature detecting element TD to detect temperature increase, thereby enabling reduction of malfunction and breakdown.

Note that the temperature detecting element TD may be arranged on the outer peripheral portion 600 of the semiconductor substrate SB, or may be arranged in a region (hereinafter referred to as inner region) positioned inside the active region 500. FIG. 12 illustrates a form in which the temperature detecting element TD is continuously arranged on the outer peripheral portion 600 of the semiconductor substrate SB and the inner region. Such a form would enable the temperature detecting element TD to be positioned close to a bonding portion between the source electrode SE and a conductive wire (unillustrated) and measure temperature of a region where heat generation is most likely to occur (for example, the bonding portion between the source electrode SE and the wire). This enables the temperature detecting element TD to detect temperature increase earlier.

Embodiment 3

Figure 16:
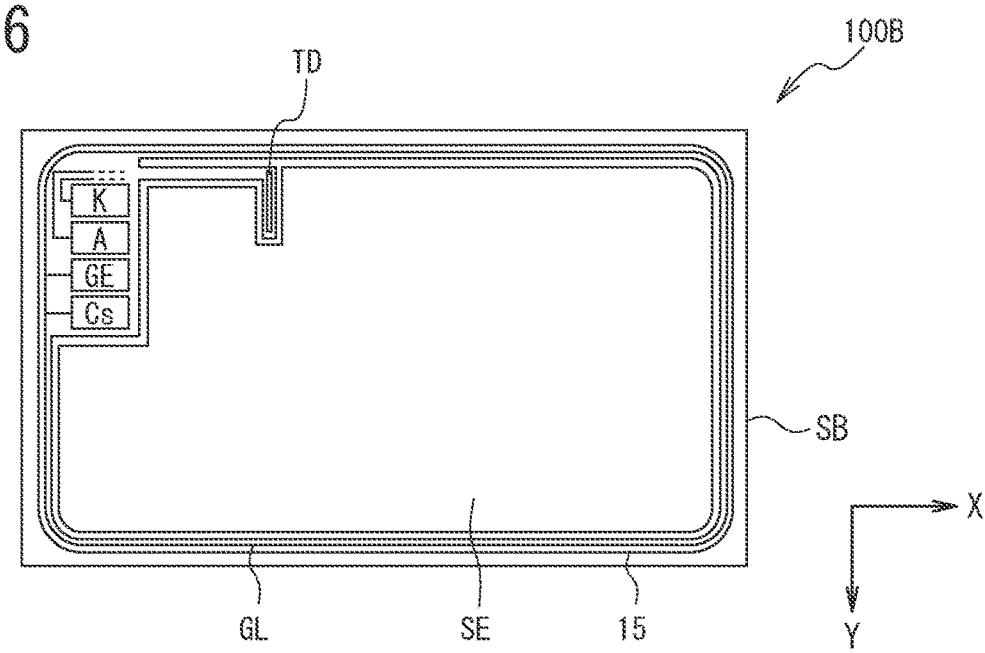
FIG. 16 is a plan view illustrating a structure of a semiconductor element according to Embodiment 3 of the present invention.
Figure 17:
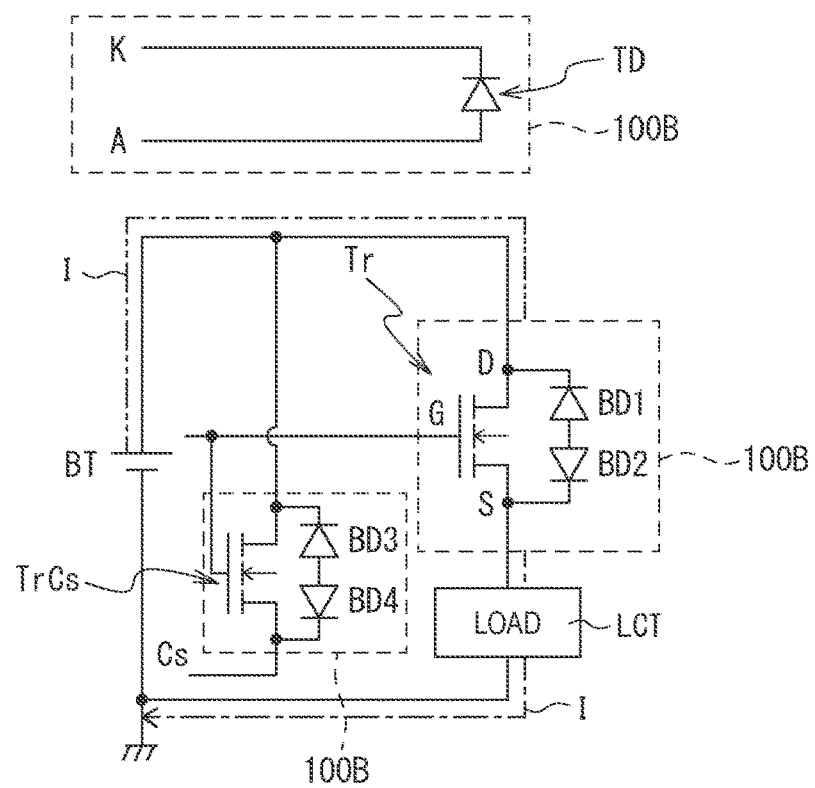
FIG. 17 is a circuit diagram illustrating the structure of the semiconductor element according to Embodiment 3 of the present invention.
Figure 18:
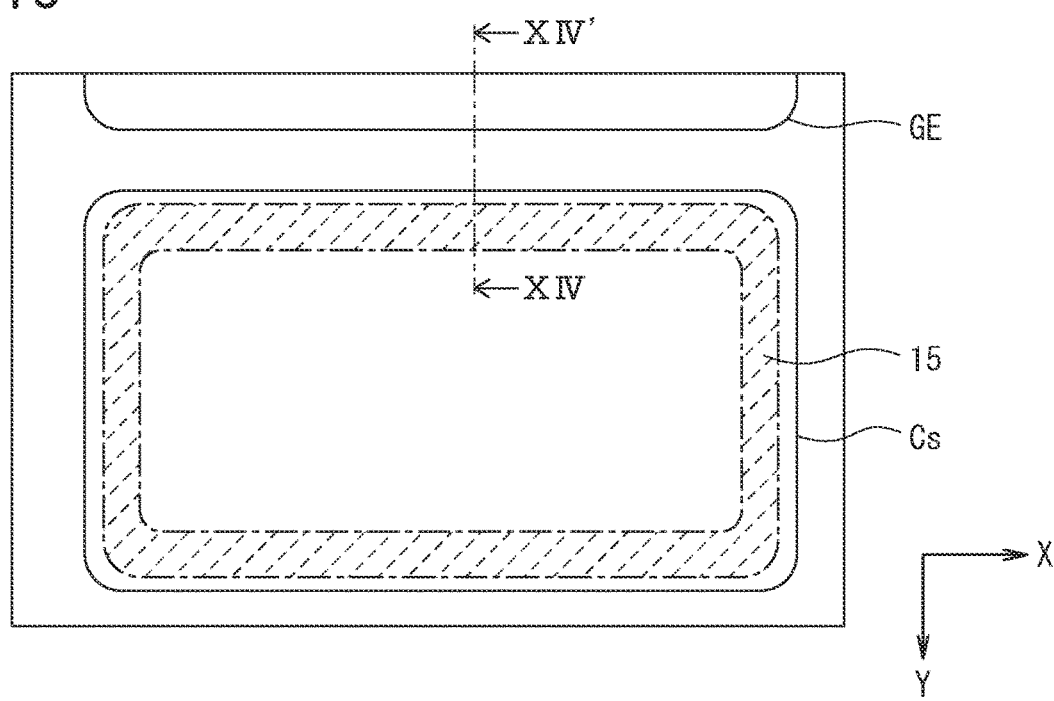
FIG. 18 is a plan view illustrating a structural example of a current detecting electrode pad Cs and a vicinity thereof according to Embodiment 3 of the present invention.
Figure 19:
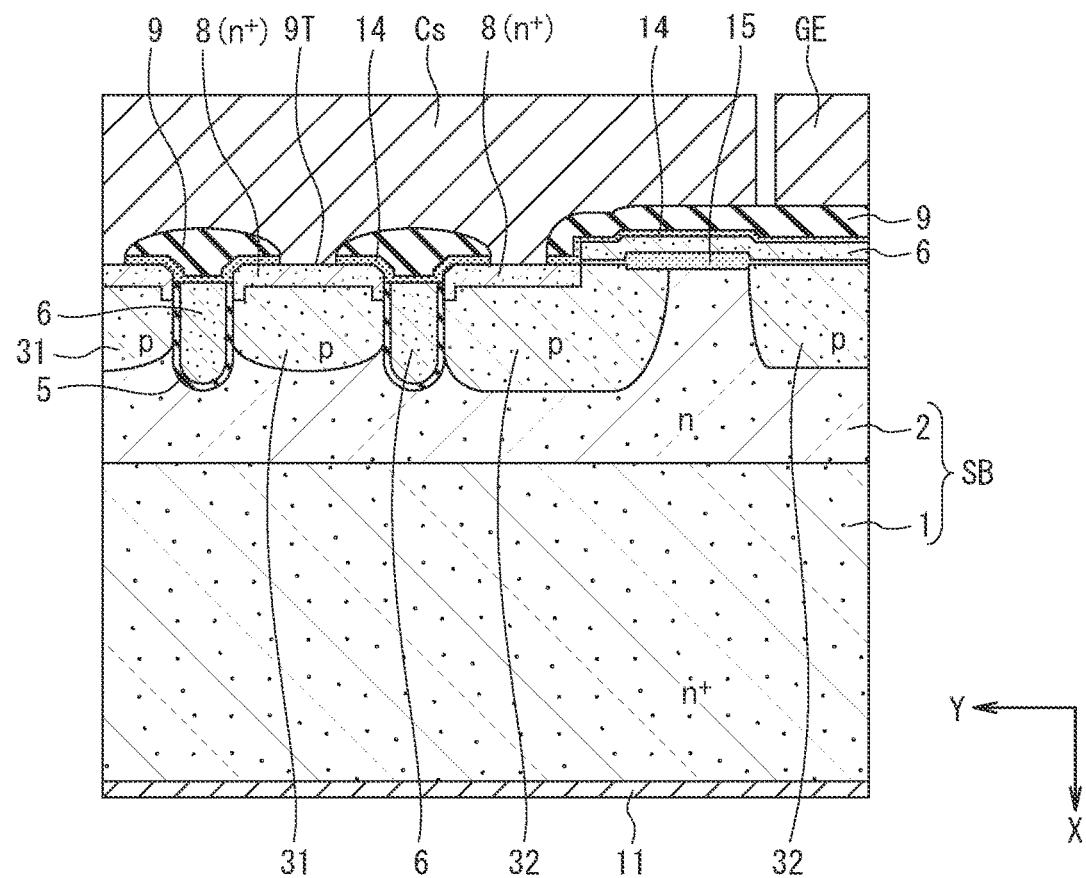
FIG. 19 is a cross-sectional view illustrating the structural example of the current detecting electrode pad Cs and the vicinity thereof according to Embodiment 3 of the present invention.

FIG. 16 is a plan view illustrating a structure of a semiconductor element according to Embodiment 3 of the present invention. FIG. 17 is a circuit diagram illustrating a structural example of the semiconductor element according to Embodiment 3 of the present invention. FIG. 18 is a plan view illustrating a structural example of a current detecting electrode pad Cs and a vicinity thereof according to Embodiment 3 of the present invention. FIG. 19 is a cross-sectional view illustrating the structural example of the current detecting electrode pad Cs and the vicinity thereof according to Embodiment 3 of the present invention. A semiconductor element 100B according to Embodiment 3 of the present invention further includes the current detecting electrode pad Cs configured to detect current in the semiconductor element 100A according to Embodiment 2 of the present invention. Note that the gate wire GL illustrated in FIG. 16 is indicated by a single line to simplify the drawing.

As illustrated in FIG. 16, the semiconductor element 100B includes the gate electrode pad GE, the cathode electrode pad K, the anode electrode pad A, and the current detecting electrode pad Cs. The gate electrode pad GE, the cathode electrode pad K, the anode electrode pad A, and the current detecting electrode pad Cs are arranged side by side in the Y axis direction.

As illustrated in FIG. 17, a current detecting transistor TrCs is an n-channel type MOSFET designed to handle small electric power, as compared with the MOS transistor Tr. A drain of the current detecting transistor TrCs is connected to the drain D of the MOS transistor Tr. A source of the current detecting transistor TrCs is connected to a control element (unillustrated) via the current detecting electrode pad Cs. A gate of the current detecting transistor TrCs is connected to the gate G of the MOS transistor Tr, and connected to the control element via the gate electrode pad GE. This allows the control element to control turning on and off of the current detecting transistor TrCs. When the current detecting transistor TrCs is turned on, a very small part of the current I (for example, about 1/10000 of the current I) flowing from the power supply unit BT to the load LCT is supplied to the control element via the current detecting transistor TrCs and the current detecting electrode pad Cs. The current detecting transistor TrCs includes a third body diode BD3 and a fourth body diode BD4.

The control element can calculate a value of the current I flowing from the power supply unit BT to the load LCT on the basis of a value of the current supplied from the current detecting electrode pad Cs. For example, assume that the current supplied via the current detecting electrode pad Cs is set to 1/10000 of the current I flowing from the power supply unit BT to the load LCT. In this case, the control element can calculate the value of the current I by multiplying a detected current value by 10000.

As illustrated in FIG. 16, the temperature detecting element TD is included in the semiconductor element 100B. However, as illustrated in the circuit diagram of FIG. 17, the temperature detecting element TD is not connected to the MOS transistor Tr and the current detecting transistor TrCs.

FIG. 18 is the plan view illustrating the structural example of the current detecting electrode pad Cs and the vicinity thereof according to Embodiment 3 of the present invention. FIG. 19 is the cross-sectional view illustrating the structural example of the current detecting electrode pad Cs and the vicinity thereof according to Embodiment 3 of the present invention. FIG. 19 illustrates a cross section taken along line XIV-XIV' of FIG. 18. As illustrated in FIG. 18 and FIG. 19, a plurality of current detecting transistors TrCs is provided in a region immediately under the current detecting electrode pad Cs. The current detecting transistors TrCs have the same structure as that of MOS transistors Tr. The current detecting transistors TrCs are formed simultaneously with the MOS transistors Tr in the same step. The current detecting transistors TrCs electrically connected to the current detecting electrode pad Cs are arranged away from the active region 500 of the MOS transistors Tr. For example, as illustrated in FIG. 18, a circumference of the current detecting transistors TrCs electrically connected to the current detecting electrode pad Cs is surrounded by the LOCOS film 15. For example, an area occupied by the current detecting transistors TrCs is 1/10000 of an area occupied by the MOS transistors Tr (i.e., an area of the active region 500 of the MOS transistors Tr).

Additionally, to make desirable a ratio between the area occupied by the current detecting transistor TrCs and the area occupied by the MOS transistors Tr, a portion for providing the source regions 8 of the current detecting transistors TrCs illustrated in FIG. 19 may be reduced in size to make small the area of the active region 500 of the current detecting transistors TrCs.

Providing the current detecting transistors TrCs enables current detection to be performed with small loss and high efficiency when large current flows in the MOS transistors Tr. In addition, providing the current detecting transistors TrCs enables instantaneous monitoring of changes in current. This enables detection of a sign of abnormality to prevent breakdowns of the MOS transistors Tr.

Note that the structure of the current detecting transistors TrCs may be the same as that of any one of the MOS transistor TrA illustrated in FIG. 9, the MOS transistor TrB illustrated in FIG. 10, or the MOS transistor TrC illustrated in FIG. 11.

Modification 4

Figure 20:
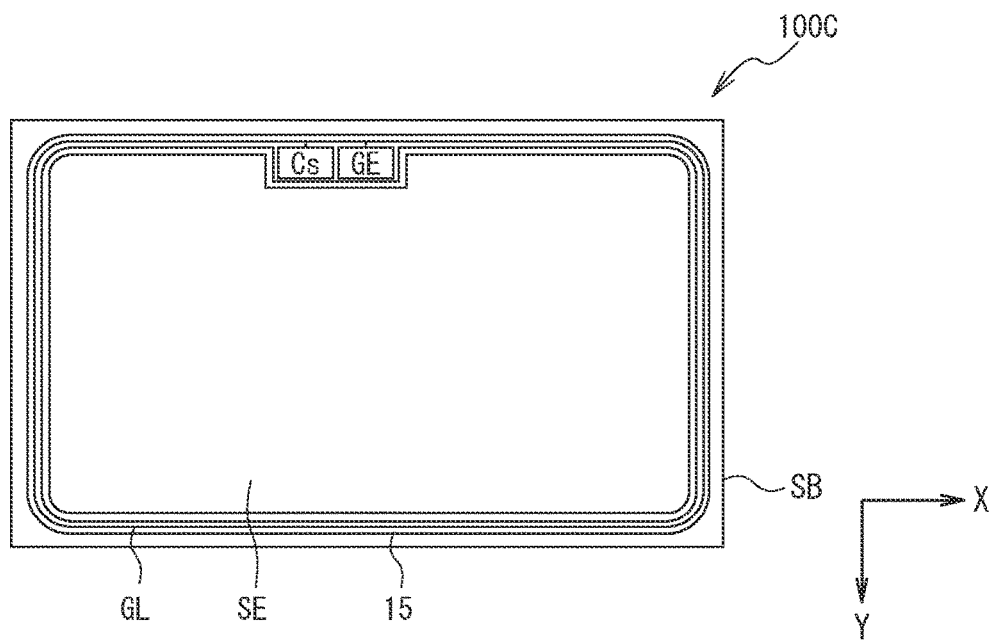
FIG. 20 is a plan view illustrating a structure of a semiconductor element according to Modification 4 of Embodiment 1 of the present invention.
Figure 21:
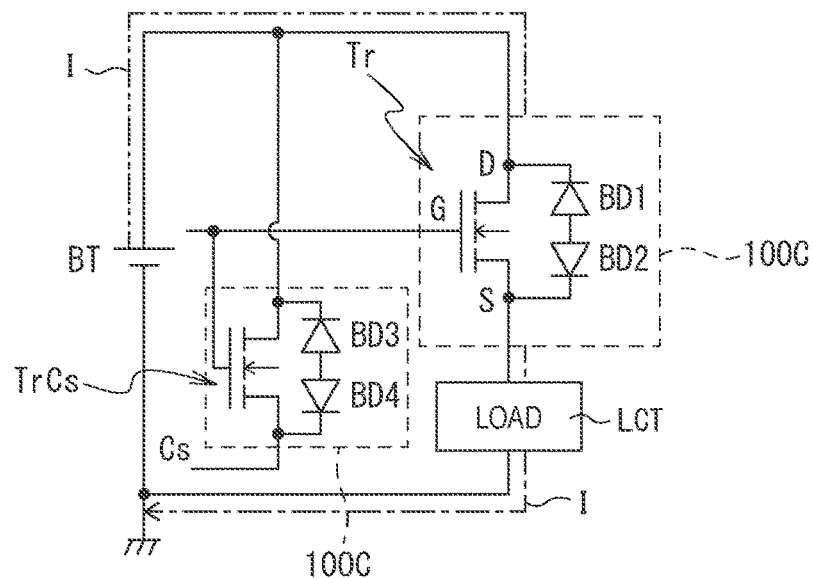
FIG. 21 is a circuit diagram illustrating the structure of the semiconductor element according to Modification 4 of Embodiment 1 of the present invention.

The semiconductor element 100 according to Embodiment 1 of the present invention may include the current detecting electrode pad Cs configured to detect current. FIG. 20 is a plan view illustrating a structure of a semiconductor element according to Modification 4 of Embodiment 1 of the present invention. FIG. 21 is a circuit diagram illustrating the structure of the semiconductor element according to Modification 4 of Embodiment 1 of the present invention. Note that the gate wire GL illustrated in FIG. 20 is indicated by a single line to simplify the drawing.

As illustrated in FIG. 20, a semiconductor element 100C according to Modification 4 of Embodiment 1 includes the current detecting electrode pad Cs. The current detecting electrode pad Cs is provided on the front surface 2a side of the semiconductor substrate SB. The structure of the current detecting electrode pad Cs is the same as that of the current detecting electrode pad Cs of Embodiment 3.

As illustrated in FIG. 21, the circuit diagram illustrating the structure of the semiconductor element 100C according to Modification 4 of Embodiment 1 is the same as a structure in which the temperature detecting element TD is not included in FIG. 17 of Embodiment 3.

The structure enables calculation of the value of the current I flowing from the power supply unit BT to the load LCT on the basis of the value of current supplied from the current detecting electrode pad Cs. Providing the current detecting transistors TrCs enables current detection to be performed with small loss and high efficiency when large current flows in the MOS transistors Tr. In addition, providing the current detecting transistor TrCs enables instantaneous monitoring of changes in current. This enables detection of a sign of abnormality to prevent breakdowns of the MOS transistors Tr.

Embodiment 4

Figure 22:
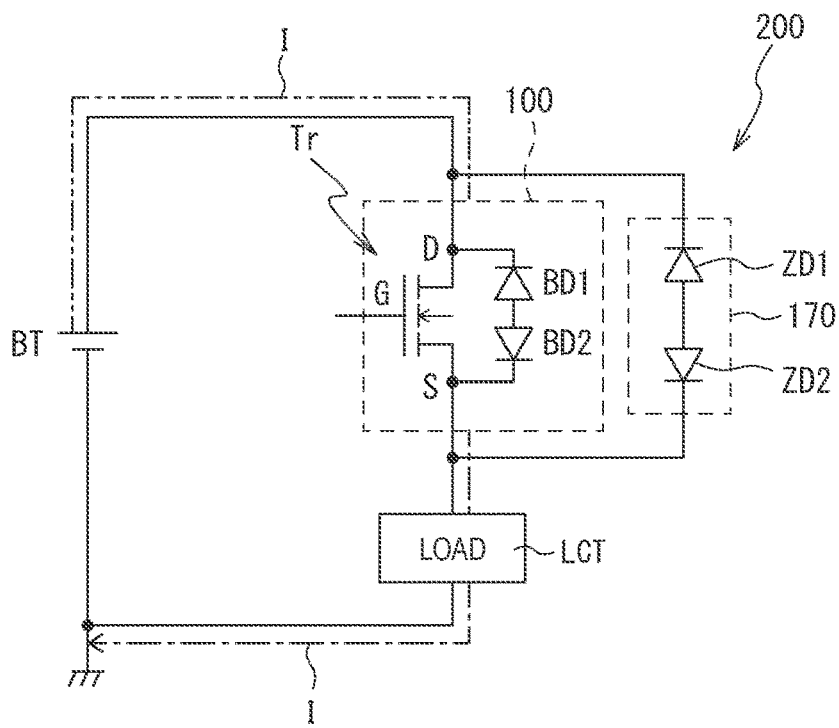
FIG. 22 is a circuit diagram illustrating a structural example of a semiconductor device according to Embodiment 4 of the present invention.

FIG. 22 is a circuit diagram illustrating a structural example of a semiconductor device according to Embodiment 4 of the present invention. As illustrated in FIG. 22, a semiconductor device 200 according to Embodiment 4 includes the above-described semiconductor element 100 (or any one of the semiconductor elements 100A, 100B, or 100C) and a protecting element 170 configured to protect the semiconductor element 100. The protecting element 170 is an element prepared separately of the semiconductor element 100. The protecting element 170 is externally attached to an electric circuit including the power supply unit BT, the load LCT, and the semiconductor element 100.

The protecting element 170 includes a Zener diode (for example, a first Zener diode ZD1 and a second Zener diode ZD2) having a lower breakdown voltage than the semiconductor element 100. The first Zener diode ZD1 and the second Zener diode ZD2 are connected in series to each other. Additionally, a forward direction of the first Zener diode ZD1 is reserve to a forward direction of the second Zener diode ZD2.

As illustrated in FIG. 22, a cathode of the first Zener diode ZD1 is connected to the positive electrode of the power supply unit BT. The cathode of the first Zener diode ZD1, rather than the drain D of the MOS transistor Tr, is connected to a side closer to the positive electrode of the power supply unit BT (i.e., an upstream side of the electric circuit). Additionally, an anode of the first Zener diode ZD1 is connected to an anode of the second Zener diode ZD2. A cathode of the second Zener diode ZD2 is connected to the load LCT. The cathode of the second Zener diode ZD2, rather than the source S of the MOS transistor Tr, is connected to a side closer to the load LCT (i.e., a downstream side of the electric circuit).

The first Zener diode ZD1 has a lower breakdown voltage than a breakdown voltage of the first body diode BD1. Additionally, the second Zener diode ZD2 has a lower breakdown voltage than a breakdown voltage of the second body diode BD2. In addition, the power supply unit BT has a lower output voltage than the breakdown voltage of the first Zener diode ZD1 and the breakdown voltage of the second Zener diode ZD2. Here is an example where the breakdown voltage of the first body diode BD1 and the breakdown voltage of the second body diode BD2, respectively, are 40 V; the breakdown voltage of the first Zener diode ZD1 and the breakdown voltage of the second Zener diode ZD2, respectively, are 20 V; and the output voltage of the power supply unit BT is 16 V. The semiconductor device 200 is designed such that in either case of normal connection or reverse connection, the first Zener diode ZD1 and the second Zener diode ZD2 do not break down unless abnormal voltage such as surge is applied.

In the semiconductor device 200 according to Embodiment 4, when abnormal voltage such as surge is applied, the first Zener diode ZD1 or the second Zener diode ZD2 breaks down before MOS transistor Tr breakdown, and thereby current flows. For example, when in normal connection, the first Zener diode ZD1 breaks down, and the protecting element 170 causes current to flow. Alternatively, when in reverse connection, the second Zener diode ZD2 breaks down, and the protecting element 170 causes current to flow. By doing this, the protecting element 170 can prevent the semiconductor element 100 from being broken by abnormal voltage such as surge.

Note that the protecting element 170 preferably includes both the first Zener diode ZD1 and the second Zener diode ZD2, but may include only one of the first or second Zener diode ZD1 or ZD2. The inclusion of the first Zener diode ZD1 in the protecting element 170 enables the protecting element 170 to protect the semiconductor element 100 in normal connection from abnormal voltage such as surge. The inclusion of the second Zener diode ZD2 in the protecting element 170 enables the protecting element 170 to protect the semiconductor element 100 in reverse connection from abnormal voltage such as surge.

Other Embodiments

As described above, the present invention has been described in terms of some embodiments and modifications. However, it should not be understood that the description and drawings constituting parts of this disclosure limit the present invention. Various alternative embodiments and modifications will be apparent to those skilled in the art from the disclosure.

For example, in the above embodiments, it has been described that the semiconductor substrate SB includes the support substrate 1 and the semiconductor layer 2 formed on the front surface 1a of the support substrate 1. The support substrate 1 has been described as being the single crystal Si substrate, and the semiconductor layer 2 has been described as being the single crystal Si layer. However, in embodiments of the present invention, the structure of the semiconductor substrate SB is not limited thereto. The semiconductor substrate SB may include only a single crystal Si substrate. Alternatively, the semiconductor substrate SB may include only a single crystal Si layer.

For example, while the above embodiments and modifications have been described as having the trench-gate structure, a planar-gate structure may be employed instead.

In addition, the gate insulating film 5 is not limited to the $SiO_2$ film, and may be an insulating film other than that. Usable examples of the gate insulating film 5 include a siliconoxynitride (SiON) film, a strontium oxide (SrO) film, a silicon nitride ($Si_3N_4$) film, and an aluminum oxide ($Al_2O_3$) film. Additionally, a composite film formed by laminating a plurality of single-layer insulating films, or the like is also usable as the gate insulating film 5. A MOS transistor formed by using an insulating film other than an $SiO_2$ film as the gate insulating film 5 may be referred to as metal insulator semiconductor (MIS) transistor. The term "MIS transistor" means a more comprehensive insulated gate transistor, including a MOS transistor.

REFERENCE SIGNS LIST

1: Support substrate
1a: Front Surface
1b: Back surface
2: Semiconductor layer
2a: Front surface
2T: Trench
5: Gate insulating film
5A: Insulating film
6: Gate electrode
6A: Field plate
6B: Semiconductor film
8: Source region
8a, 9a: Upper surface
9: Interlayer insulating film
9T: Contact
11: Back surface electrode
12: Barrier metal
13: Plug electrode
14: Insulating film
15: LOCOS film
21: Drift region
31: Well region
32: Resurf region
33: Channel stopper region
40: p-n junction diode
41: p-type semiconductor layer
42: n-type semiconductor layer
43: Relay electrode
100, 100A, 100B, 100C: Semiconductor element
170: Protecting element
200: Semiconductor device
500: Active region
600: Outer peripheral portion
A: Anode electrode pad
AL: Anode wire
BD1: First body diode
BD2: Second body diode
BD3: Third body diode
BD4: Fourth body diode
BT: Power supply unit
ECU: Electronic control unit
GE: Gate electrode pad
GL: Gate wire
K: Cathode electrode pad
KL: Cathode wire
LCT: Load
SB: Semiconductor substrate
SE: Source electrode
Tr, TrA, TrB, TrC: MOS transistor
TrCs: Current detecting MOS transistor
ZD1: First Zener diode
ZD2: Second Zener diode

The invention claimed is:

1. A semiconductor element comprising:
a semiconductor substrate including a support substrate of a first conductivity type and a semiconductor layer of the first conductivity type formed on one surface of the support substrate, the support substrate having a higher concentration of impurities of the first conductivity type than the semiconductor layer;
an active region on the semiconductor layer and comprising a field effect transistor, the field effect transistor comprising:
a first electrode on one surface side of the semiconductor substrate;
an electrode region of the first conductivity type connected to the first electrode,
a drift region of the first conductivity type arranged away from the electrode region,
a well region of a second conductivity type arranged between the electrode region and the drift region, the drift region being under the well region,
a source region of the first conductivity type on the well region,
a trench penetrating through the well region from a front surface of the electrode region,
a gate insulating film arranged in the trench and covering a bottom face and a side face of the trench,
a gate electrode embedded in the trench via the gate insulating film, a part of the gate electrode being drawn out onto the semiconductor layer covered with the gate insulating film,
a first body diode between the drift region and the well region, and
a second body diode between the well region and the electrode region, the first body diode and the second body diode being connected in series to each other, and a forward direction of the first body diode being reverse to a forward direction of the second body diode;
an outer peripheral portion surrounding the active region and being outside of the electrode region, the outer peripheral region comprising:
a gate wire electrically connected to the gate electrode and surrounding the active region,
a channel stopper region on the outer peripheral region, the channel stopper region and the well region having mutually the same depth from a front surface of the semiconductor layer,
a local oxidation of silicon (LOCOS) film surrounding the active region, and
a field plate electrically separated from the gate electrode and fixed at a different potential than the gate electrode; and
a resurf region to straddle the active region and the outer peripheral region, a depth of the resurf region from the front surface being deeper than the depth of the well region from the front surface.

2. The semiconductor element according to claim 1, further comprising a barrier metal between the first electrode and the electrode region.

3. The semiconductor element according to claim 1, further comprising a second electrode provided on another surface side of the semiconductor substrate.

4. The semiconductor element according to claim 3, wherein the first body diode is electrically connected to the second electrode and the second body diode is electrically connected to the first electrode.

5. The semiconductor element according to claim 1, wherein the field effect transistor is a vertical MOS transistor with a trench gate structure.

6. The semiconductor element according to claim 5, further comprising a gate electrode pad electrically connected to the gate electrode.

7. The semiconductor element according to claim 1, further comprising a temperature detecting element provided on the semiconductor substrate.

8. The semiconductor element according to claim 7, wherein the temperature detecting element includes a diode including a first conductivity type layer and a second conductivity type layer connected to the first conductivity type layer.

9. The semiconductor element according to claim 1, further comprising a current detecting element provided on the semiconductor substrate.

10. The semiconductor element according to claim 9, wherein the current detecting element is a current detecting field effect transistor.

11. The semiconductor element according to claim 1, wherein the semiconductor substrate includes, on a first semiconductor layer of the first conductivity type, a second semiconductor layer of the first conductivity type having a lower impurity concentration than the first semiconductor layer.

12. A semiconductor element comprising:
  a field effect transistor including:
    an active region comprising:
      a first body diode formed between a drift region and a well region of the field effect transistor and connected to a drain of the field effect transistor, the first body diode comprising the drift region and the well region, and
      a second body diode formed between a well region and an electrode region of the field effect transistor and connected to a source of the field effect transistor, the second body diode comprising the well region and the electrode region,
      wherein a forward direction of the first body diode is reverse of a forward direction of the second body diode, and the first body diode and the second body diode are connected in series to each other;
    an outer peripheral region surrounding the active region and comprising:
      a gate wire electrically connected to the gate electrode and surrounding the active region,
      a channel stopper region on the outer peripheral region, the channel stopper region and a well region of the active region having mutually the same depth from a front surface of the field effect transistor,
      a local oxidation of silicon (LOCOS) film surrounding the active region, and
      a field plate electrically separated from a gate electrode of the active region and fixed at a different potential than the gate electrode; and
    a resurf region to straddle the active region and the outer peripheral region, a depth of the resurf region from the front surface being deeper than the depth of the well region from the front surface.

13. A semiconductor device comprising:
  the semiconductor element according to claim 1; and
  a protecting element configured to protect the semiconductor element,
  wherein the protecting element includes a Zener diode having a lower breakdown voltage than the semiconductor element.

14. The semiconductor element according to claim 2, further comprising a second electrode provided on another surface side of the semiconductor substrate.

15. The semiconductor element according to claim 2, further comprising a trench penetrating through the well region from a front surface of the electrode region, a gate insulating film arranged in the trench, and a gate electrode embedded in the trench via the gate insulating film.

16. The semiconductor element according to claim 3, further comprising a trench penetrating through the well region from a front surface of the electrode region, a gate insulating film arranged in the trench, and a gate electrode embedded in the trench via the gate insulating film.

17. The semiconductor element according to claim 4, further comprising a trench penetrating through the well region from a front surface of the electrode region, a gate insulating film arranged in the trench, and a gate electrode embedded in the trench via the gate insulating film.

18. The semiconductor element according to claim 2, further comprising a temperature detecting element provided on the semiconductor substrate.

19. The semiconductor element according to claim 3, further comprising a temperature detecting element provided on the semiconductor substrate.

20. The semiconductor element according to claim 4, further comprising a temperature detecting element provided on the semiconductor substrate.

21. The semiconductor element according to claim 1, wherein the first electrode is not directly contacted with the well region.

* * * * *